US012598827B2

(12) United States Patent
Fujii et al.

(10) Patent No.: US 12,598,827 B2
(45) Date of Patent: Apr. 7, 2026

(54) SOLID-STATE IMAGING DEVICE AND MANUFACTURING METHOD THEREFOR

(71) Applicant: SONY SEMICONDUCTOR SOLUTIONS CORPORATION, Kanagawa (JP)

(72) Inventors: Nobutoshi Fujii, Kanagawa (JP); Suguru Saito, Kanagawa (JP); Takashi Fukatani, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 388 days.

(21) Appl. No.: 18/003,960

(22) PCT Filed: Jun. 25, 2021

(86) PCT No.: PCT/JP2021/024097
§ 371 (c)(1),
(2) Date: Dec. 30, 2022

(87) PCT Pub. No.: WO2022/009693
PCT Pub. Date: Jan. 13, 2022

(65) Prior Publication Data
US 2023/0261016 A1      Aug. 17, 2023

(30) Foreign Application Priority Data
Jul. 9, 2020    (JP) ................................. 2020-118291

(51) Int. Cl.
*H10F 39/00*          (2025.01)
(52) U.S. Cl.
CPC ....... *H10F 39/8057* (2025.01); *H10F 39/024* (2025.01); *H10F 39/802* (2025.01)

(58) Field of Classification Search
None
See application file for complete search history.

(56) References Cited

U.S. PATENT DOCUMENTS

2004/0166654 A1* 8/2004 Matsuda ............... H10F 39/026
                                                          438/460
2011/0169118 A1   7/2011 Sano
                        (Continued)

FOREIGN PATENT DOCUMENTS

JP      H04-258165      9/1992
JP      H06-292206      10/1994
                  (Continued)

OTHER PUBLICATIONS

International Search Report and Written Opinion prepared by the Japan Patent Office on Aug. 23, 2021, for International Application No. PCT/JP2021/024097, 3 pgs.

*Primary Examiner* — Nilufa Rahim
(74) *Attorney, Agent, or Firm* — SHERIDAN ROSS P.C.

(57)          ABSTRACT
The present feature relates to a solid-state imaging device that allows generation of flare to be reduced and a manufacturing method therefor. A solid-state imaging device according to the present feature includes a semiconductor substrate having a pixel area having a plurality of pixels provided therein, and a transparent structure joined to a light incident surface side of the semiconductor substrate with resin and having a hollow structure. In the solid-state imaging device according to the present feature, the transparent structure includes a glass substrate and a transparent film, and the hollow structure is formed between the glass substrate and the transparent film. The present feature can be applied for example to imaging devices.

20 Claims, 28 Drawing Sheets

(56)                    References Cited

U.S. PATENT DOCUMENTS

| | | | |
|---|---|---|---|
| 2013/0032914 A1 | 2/2013 | Iwasaki | |
| 2013/0194464 A1 | 8/2013 | Suzuki et al. | |
| 2019/0076002 A1* | 3/2019 | Shimohata | H04N 23/55 |
| 2020/0303438 A1* | 9/2020 | Ooki | H10F 39/803 |
| 2021/0020671 A1* | 1/2021 | Cheng | H10F 39/199 |
| 2021/0327941 A1* | 10/2021 | Lee | H10F 39/8057 |

FOREIGN PATENT DOCUMENTS

| | | |
|---|---|---|
| JP | 2011-146486 | 7/2011 |
| JP | 2012-114370 | 6/2012 |
| JP | 2013-038164 | 2/2013 |
| JP | 2013-041878 | 2/2013 |
| WO | WO 2017/163924 | 9/2017 |
| WO | WO 2019/069733 | 4/2019 |

* cited by examiner

CCU

LIGHT SOURCE
DEVICE

INPUT DEVICE

TREATMENT TOOL
CONTROL DEVICE

PNEUMOPERITONEUM
DEVICE

RECORDER

PRINTER

SOLID-STATE IMAGING DEVICE AND MANUFACTURING METHOD THEREFOR

CROSS REFERENCE TO RELATED APPLICATIONS

This application is a national stage application under 35 U.S.C. 371 and claims the benefit of PCT Application No. PCT/JP2021/024097, having an international filing date of 25 Jun. 2021, which designated the United States, which PCT application claimed the benefit of Japanese Patent Application No. 2020-118291, filed 9 Jul. 2020, the entire disclosures of each of which are incorporated herein by reference.

TECHNICAL FIELD

The present feature relates to a solid-state imaging device and a manufacturing method therefor, and particularly to a solid-state imaging device that allows flare generation to be reduced and a manufacturing method therefor.

BACKGROUND ART

To meet demands for more compact semiconductor devices, wafer level chip size packages (WCSP) have been developed, which allows semiconductor devices to be downsized to chip size level.

For example, PTL 1 discloses a semiconductor device having an overall height reduced by fixing a glass substrate on an upper surface side of a semiconductor substrate having color filters and on-chip lenses thereon through glass sealing resin in a cavity-less structure.

CITATION LIST

Patent Literature

[PTL 1]
WO 2017/163924

SUMMARY

Technical Problem

When a semiconductor substrate and a glass substrate are fixed in a cavity-less structure, strong incident light may be reflected by an on-chip lens on a certain pixel and then totally reflected on the top surface of the glass substrate to reenter other pixels. This may cause noise called a flare.

With the foregoing in view, the present feature is directed to reduction of flare generation.

Solution to Problem

A solid-state imaging device according to a first aspect of the present feature includes a semiconductor substrate having a pixel area having a plurality of pixels provided therein, and a transparent structure joined to a light incident surface side of the semiconductor substrate with resin and having a hollow structure.

A method for manufacturing a solid-state imaging device according to a second aspect of the present feature includes forming a hollow structure in a transparent structure and joining the transparent structure to a light incident surface side of a semiconductor substrate having a plurality of pixel areas with resin.

According to the first aspect of the present feature, a semiconductor substrate having a pixel area having a plurality of pixels therein and a light incident surface side of the semiconductor substrate are joined with resin, so that a transparent structure having a hollow structure is provided.

According to the second aspect of the present feature, a hollow structure is formed in a transparent structure, and the transparent structure is joined with resin to a light incident surface side of a semiconductor substrate having a plurality of pixel areas.

BRIEF DESCRIPTION OF DRAWINGS

FIG. 8 is a view for illustrating an effect of a hollow structure.

FIG. 9 is a view for illustrating an effect of a hollow structure.

FIG. 25 schematically illustrates an exemplary endoscopic operation system.

DESCRIPTION OF EMBODIMENTS

Figure 1:
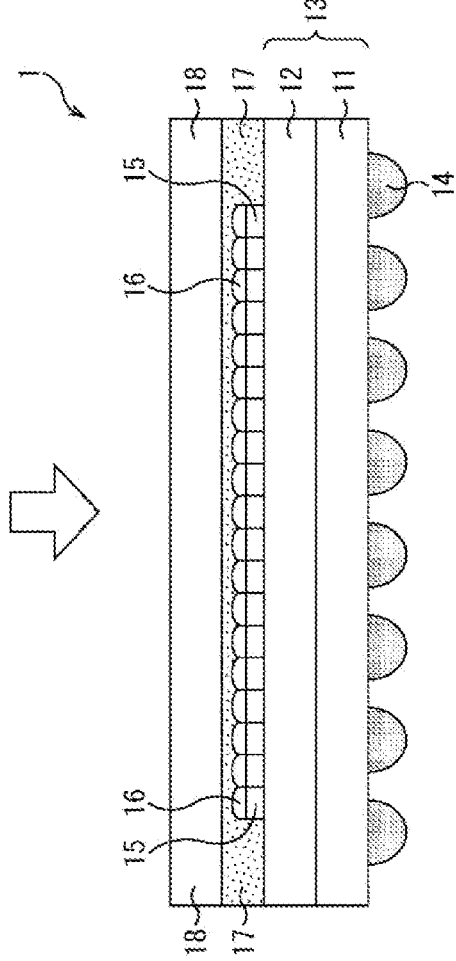
FIG. 1 is a schematic external view of a solid-state imaging device according to the present disclosure.

An embodiment for implementing the present feature will be described. The description will be made in the following order.

1. Embodiment of solid-state imaging device
2. Method for forming cavities
3. Other exemplary patterns of openings
4. Further exemplary patterns of openings
5. Modifications
6. Exemplary application to electronic devices
7. Exemplary use of solid-state imaging device
8. Exemplary application to endoscopic operation system
9. Exemplary application to mobile object <1. Embodiment of Solid-State Imaging Device>
<Schematic External View>

FIG. 1 is a schematic external view of a solid-state imaging device according to an embodiment of the feature of the present disclosure.

The solid-state imaging device 1 shown in FIG. 1 is a semiconductor package in which a laminated substrate 13 including a lower substrate 11 and an upper substrate 12 placed upon each other is packaged. The solid-state imaging device 1 converts light incident in the direction indicated by the arrow in the figure into an electrical signal and outputs the signal. A plurality of solder balls 14 as backside electrodes for electrical connection with an external substrate which is not shown are formed on the lower substrate 11.

On the top surface of the upper substrate 12, R (red), G (green), or B (blue) color filters 15 and on-chip lenses 16 are formed. The upper substrate 12 is also joined to a glass protective substrate 18 for protecting the on-chip lenses 16 through glass sealing resin 17 in a cavity-less structure.

Although not shown in FIG. 1, the glass protective substrate 18 has a plurality of cavities (hollow structures) 161. The cavities 161 will be described with reference to FIG. 6.

Figure 2:
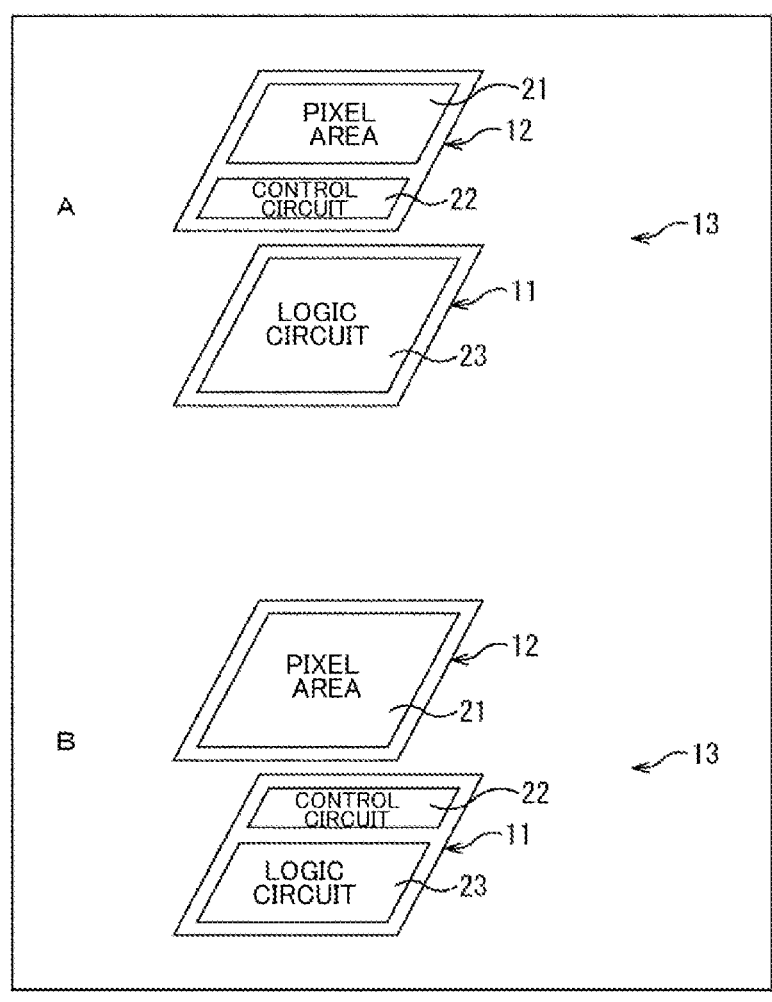
FIG. 2 illustrates a substrate configuration of the solid-state imaging device.

For example, as shown in FIG. 2 at A, the upper substrate 12 has a pixel area 21 having a two-dimensional arrangement of pixel units that perform photoelectric conversion and a control circuit 22 that controls the pixel units, and the lower substrate 11 has a logic circuit 23 such as a signal processing circuit that processes pixel signals output from the pixel units.

Alternatively, as shown in FIG. 2 at B, only the pixel area 21 may be formed at the upper substrate 12, and the control circuit 22 and the logic circuit 23 may be formed at the lower substrate 11.

As described above, the logic circuit 23 or both the control circuit 22 and the logic circuit 23 can be formed in the lower substrate 11, which is separate from the upper substrate 12 of the pixel area 21, and the substrates are layered upon each other, which allows the solid-state imaging device 1 to have a reduced size as compared to the case in which the pixel area 21, the control circuit 22, and the logic circuit 23 are arranged in a planar orientation on one semiconductor substrate.

In the following description, the upper substrate 12 having at least the pixel area 21 formed thereon will be referred to as the pixel sensor substrate 12, and the lower substrate

11 having at least the logic circuit 23 formed thereon will be referred to as the logic substrate 11.

<Exemplary Configuration of Laminated Substrate>

Figure 3:
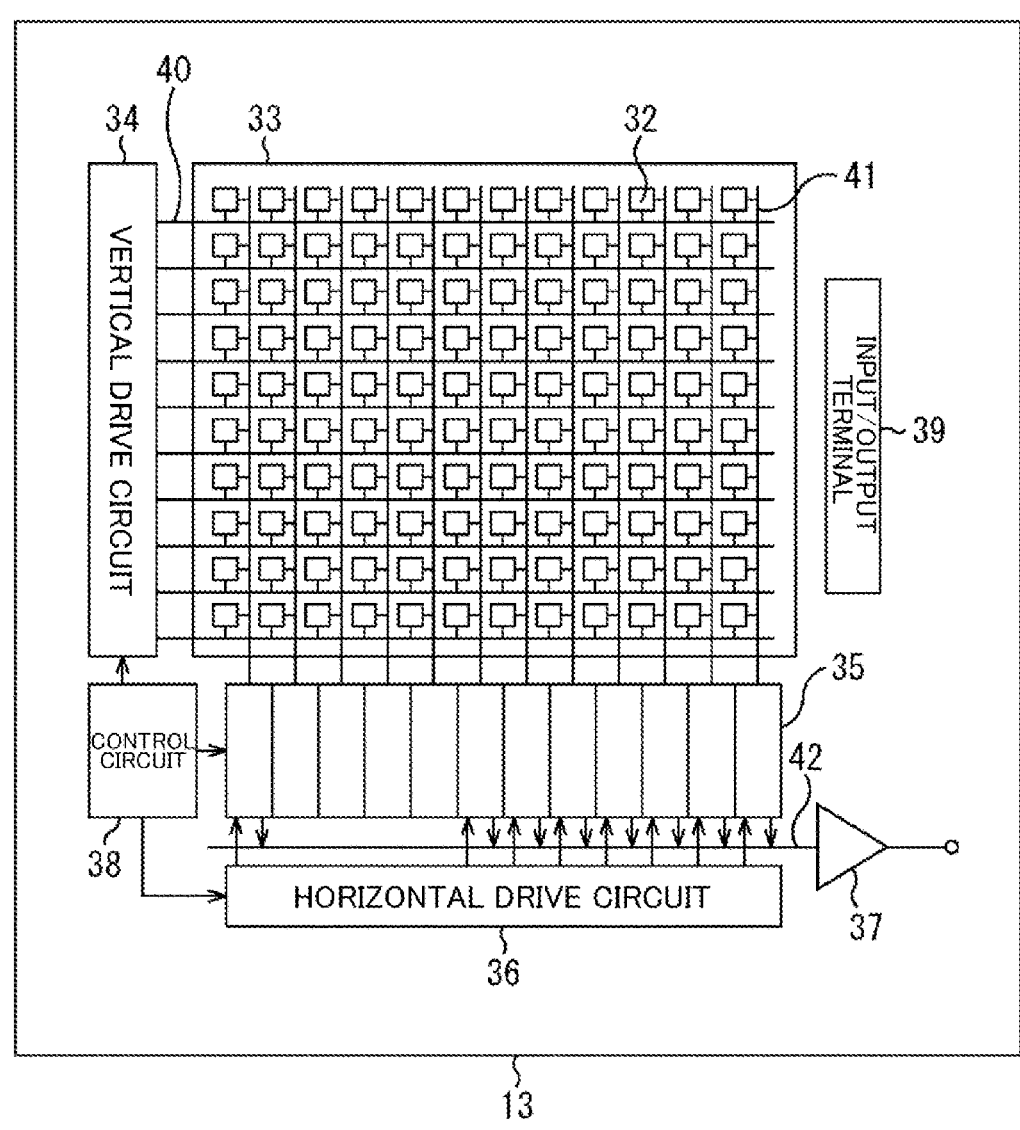
FIG. 3 is a diagram of an exemplary circuit configuration of a laminated substrate.

FIG. 3 illustrates an exemplary circuit configuration of the laminated substrate 13.

The laminated substrate 13 may include for example a pixel array section 33 having pixels 32 arranged in a two-dimensional array, a vertical drive circuit 34, a column signal processing circuit 35, a horizontal drive circuit 36, an output circuit 37, a control circuit 38, and an input/output terminal 39.

The pixel 32 includes a photodiode as a photoelectric conversion element and a plurality of pixel transistors. An exemplary circuit configuration of the pixel 32 will be described with reference to FIG. 4.

The control circuit 38 receives an input clock signal and data for instructing for example an operation mode and also outputs data such as internal information about the laminated substrate 13. In other words, in response to a vertical synchronizing signal, a horizontal synchronizing signal, and a master clock signal, the control circuit 38 generates clock signals or control signals to be used as a reference for operation by the vertical drive circuit 34, the column signal processing circuit 35, the horizontal drive circuit 36, and other elements. The control circuit 38 outputs the generated clock signals or control signals to the vertical drive circuit 34, the column signal processing circuit 35, the horizontal drive circuit 36 and other elements.

The vertical drive circuit 34 includes for example a shift register and selects a prescribed pixel drive line 40 and supplies the selected pixel drive line 40 with a pulse for driving pixels 32 to drive the pixels 32 on a row-basis. In other words, the vertical drive circuit 34 selectively scans pixels 32 in the pixel array section 33 on a row-basis in the vertical direction sequentially and supplies the column signal processing circuit 35 through a vertical signal line 41 with a pixel signal based on signal charge generated according to the amount of received light in the photoelectric conversion units of the pixels 32.

The column signal processing circuit 35 is arranged for each column of pixels 32 and performs signal processing such as noise removal to signals output from pixels 32 for one row on a column-basis. For example, the column signal processing circuit 35 performs signal processing such as correlated double sampling (CDS) and AD conversion to remove pixel-specific fixed pattern noise.

The horizontal drive circuit 36 includes for example a shift register and selects each of the column signal processing circuits 35 in turn by sequentially outputting horizontal scanning pulses and causes a pixel signal to be output from each of the column signal processing circuits 35 to a horizontal signal line 42.

The output circuit 37 performs signal processing on the signals supplied sequentially from the column signal processing circuits 35 through the horizontal signal line 42 and outputs the signals. For example, the output circuit 37 may perform only buffering in some cases, and black level adjustment, column variation compensation, and various kinds of digital signal processing in other cases. Input/output terminals 39 exchange signals with the outside.

The laminated substrate 13 having the above configuration is a CMOS image sensor called a column AD type sensor, in which the column signal processing circuit 35 that perform CDS processing and AD conversion processing is arranged for each pixel column.

<Exemplary Circuit Configuration of Pixel>

Figure 4:
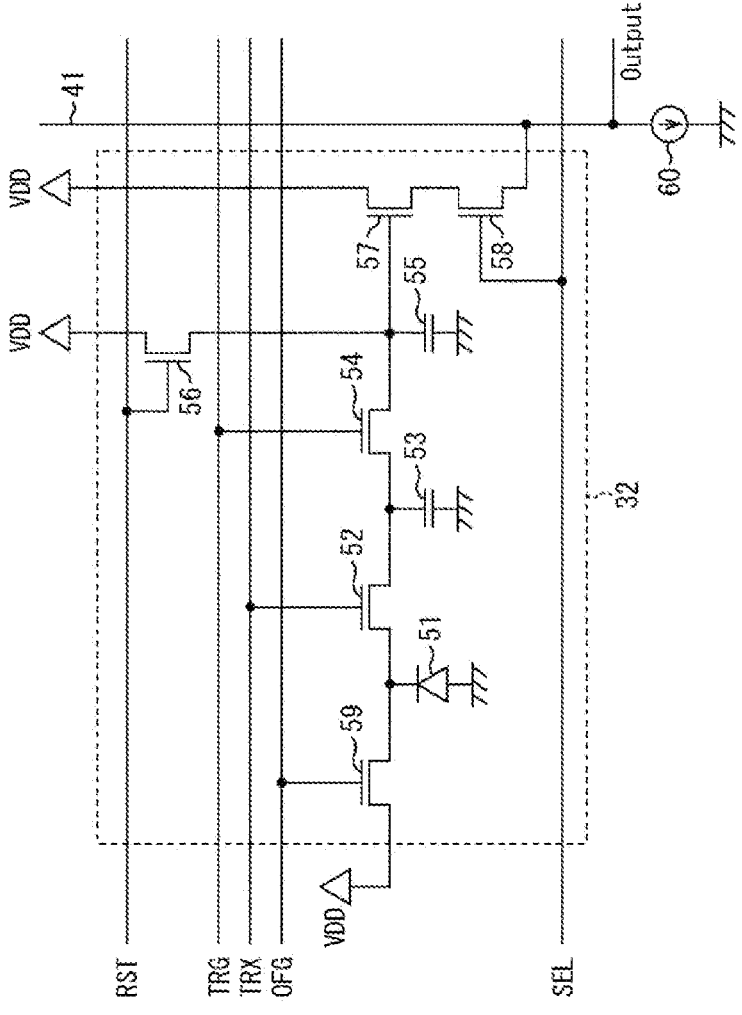
FIG. 4 is an equivalent circuit diagram of a pixel.

FIG. 4 is an equivalent circuit diagram of the pixel 32.

The pixel 32 shown in FIG. 4 is configured to function as an electronic global shutter.

The pixel 32 includes a photodiode 51 as a photoelectric conversion element, a first transfer transistor 52, a memory section (MEM) 53, a second transfer transistor 54, a floating diffusion (FD) area 55, a reset transistor 56, an amplification transistor 57, a selection transistor 58, and an discharge transistor 59.

The photodiode 51 is a photoelectric conversion unit that generates and accumulates electric charge (signal charge) according to the amount of light received. The photodiode 51 has its anode terminal grounded and its cathode terminal connected to the memory section 53 through the first transfer transistor 52. The cathode terminal of the photodiode 51 is also connected to the discharge transistor 59 for discharging unwanted charge.

When turned on in response to a transfer signal TRX, the first transfer transistor 52 reads out charge generated by the photodiode 51 and transfers the charge to the memory section 53. The memory section 53 is a charge holding unit that temporarily holds the charge until the charge is transferred to the FD 55.

When turned on in response to a transfer signal TRG, the second transfer transistor 54 reads out the charge held in the memory section 53 and transfers the charge to the FD 55.

The FD 55 is a charge holding unit that holds the charge read out from the memory section 53 as a signal to be read out. When turned on turned in response to a reset signal RST, the reset transistor 56 resets the potential of the FD 55 as the charge accumulated in the FD 55 is discharged to a constant voltage source VDD.

The amplification transistor 57 outputs a pixel signal according to the potential of the FD 55. In other words, the amplification transistor 57 constitutes a source follower circuit with a load MOS 60 as a constant current source, and a pixel signal representing a level corresponding to the charge accumulated in the FD 55 is output from the amplification transistor 57 to the column signal processing circuit 35 (FIG. 3) through the selection transistor 58. The load MOS 60 is provided for example in the column signal processing circuit 35.

The selection transistor 58 is turned on when a pixel 32 is selected in response to a selection signal SEL, and the pixel signal of the pixel 32 is output to the column signal processing circuit 35 via the vertical signal line 41.

When turned on in response to a discharge signal OFG, the discharge transistor 59 discharges unwanted charge accumulated in the photodiode 51 to the constant voltage source VDD.

The transfer signals TRX and TRG, the reset signal RST, the discharge signal OFG, and the selection signal SEL are supplied from the vertical drive circuit 34 through the pixel drive line 40.

The operation of the pixel 32 will be briefly described.

First, before exposure starts, a high level discharge signal OFG is supplied to the discharge transistor 59, which turns on the discharge transistor 59 and causes charge accumulated in the photodiode 51 to be discharged to the constant voltage source VDD, so that the photodiodes 51 of all pixels are reset.

After the photodiodes 51 is reset, when the discharge transistor 59 is turned off in response to a low level discharge signal OFG, exposure starts at all the pixels in the pixel array section 33.

After a prescribed exposure time period elapses, the first transfer transistor 52 is turned on in response to the transfer signal TRX in all the pixels in the pixel array section 33, and the charge accumulated in the photodiode 51 is transferred to the memory section 53.

After the first transfer transistor 52 is turned off, the charge accumulated in the memory sections 53 of the pixels 32 is sequentially read out to the column signal processing circuits 35 on a row-basis. In the readout operation, the second transfer transistors 54 of the pixels 32 in the readout row are turned on in response to the transfer signal TRG, and the charge accumulated in the memory sections 53 is transferred to the FD 55. Then, the selection transistor 58 is turned on in response to the selection signal SEL, so that a signal representing a level corresponding to the charge accumulated in the FD 55 is output from the amplification transistor 57 to the column signal processing circuit 35 through the selection transistor 58.

As described above, the pixels 32 each having the pixel circuit in FIG. 4 can operate (imaging) in a global shutter manner, in which the same exposure time period is set for all pixels in the pixel array section 33, the charge is temporarily held in the memory section 53 after the exposure ends, and the charge is sequentially read out on a row-basis from the memory section 53.

Note that the circuit configuration of the pixel 32 is not limited to the configuration shown in FIG. 4, and a circuit configuration that operates without the memory section 53 in a so-called rolling shutter manner may be used.

The pixel 32 can also have a shared pixel structure in which some pixel transistors are shared by multiple pixels. For example, the first transfer transistor 52, the memory section 53, and the second transfer transistor 54 may be provided for each of the pixels 32, and the FD 55, the reset transistor 56, the amplification transistor 57, and the selection transistor 58 may be shared among multiple pixels, such as four pixels.

<Exemplary Basic Structure of Solid-State Imaging Device>

Figure 5:
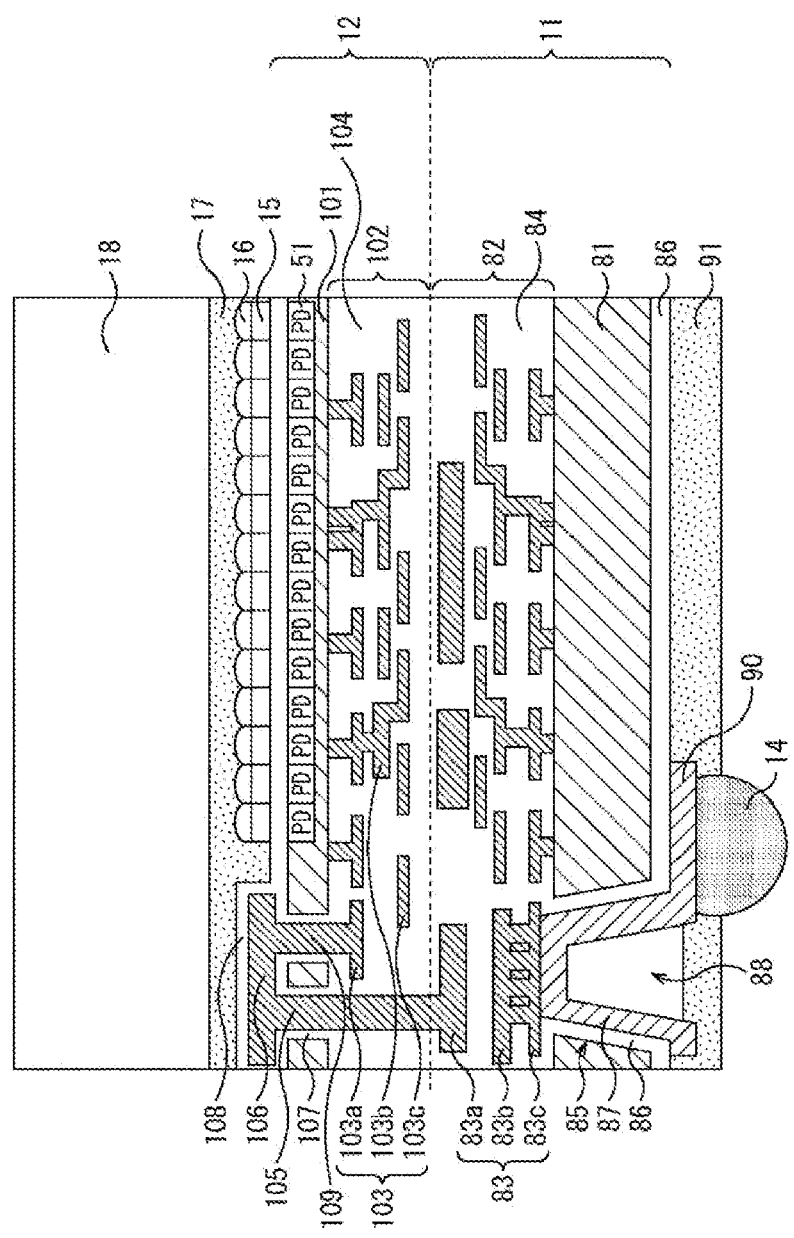
FIG. 5 is a cross-sectional view of a detailed configuration of the solid-state imaging device.

Now, with reference to FIG. 5, the detailed structure of the laminated substrate 13 will be described. FIG. 5 is a partly enlarged cross-sectional view of the solid-state imaging device 1.

The logic substrate 11 has a multilayer wiring layer 82 formed at the upper side (the side of the pixel sensor substrate 12) of a semiconductor substrate 81 (hereinafter referred to as "silicon substrate 81") for example of silicon (Si). This multilayer wiring layer 82 forms the control circuit 22 and logic circuit 23 in FIG. 2.

The multilayer wiring layer 82 includes a plurality of wiring layers 83 including an uppermost wiring layer 83a, which is the closest to the pixel sensor substrate 12, a middle wiring layer 83b, and a lowermost wiring layer 83c which is the closest to the silicon substrate 81, and an interlayer insulating film 84 formed between the wiring layers 83.

The plurality of wiring layers 83 are made for example of copper (Cu), aluminum (Al), or tungsten (W), the interlayer insulating film 84 is made for example of a silicon oxide film or a silicon nitride film. All the layers of the plurality of wiring layers 83 and the interlayer insulating film 84 may be of the same material or two or more materials may be used among different layers.

In a prescribed position of the silicon substrate 81, a silicon through-hole 85 is formed through the silicon substrate 81, and a through silicon via (TSV) 88 is formed by applying a connecting conductor 87 through an insulating film 86 at the inner wall of the silicon through hole 85. The insulating film 86 can be made for example of a SiO2 film or a SiN film.

In the through-silicon via 88 shown in FIG. 5, the insulating film 86 and the connecting conductor 87 are formed along the inner wall surface and the silicon through hole 85 is hollow inside, while the silicon through-hole 85 may be entirely filled with the connecting conductor 87 depending upon the inner diameter. Stated differently, the through hole may be filled with the conductor inside or partially hollow. This also applies to a through chip via (TCV) 105 which will be described.

The connecting conductor 87 in the through-silicon via 88 is connected to the rewiring 90 formed on the lower surface side of the silicon substrate 81, and the rewiring 90 is connected to the solder ball 14. The connecting conductor 87 and the rewiring 90 can be made for example of copper (Cu), tungsten (W), titanium (Ti), tantalum (Ta), a titanium-tungsten alloy (TiW), or polysilicon.

On the lower surface side of the silicon substrate 81, a solder mask (solder resist) 91 is formed to cover the rewiring 90 and the insulating film 86 except for the area having the solder ball 14.

Meanwhile, the pixel sensor substrate 12 has a multilayer wiring layer 102 on the lower side (the side of the logic substrate 11) of a semiconductor substrate 101 made of silicon (Si) (hereinafter referred to as the silicon substrate 101). The multilayer wiring layer 102 forms the pixel circuit in the pixel area 21 in FIG. 2.

The multilayer wiring layer 102 includes a plurality of wiring layers 103 including an uppermost wiring layer 103a which is the closest to the silicon substrate 101, a middle wiring layer 103b, and a lowermost wiring layer 103c which is the closest to the logic substrate 11 and an interlayer insulating film 104 formed between the wiring layers 103.

The materials used for the plurality of wiring layers 103 and the interlayer insulating film 104 may be the same kinds of materials as those used for the wiring layers 83 and the interlayer insulating film 84. In addition, one or more materials may be used separately for the plurality of wiring layers 103 and the interlayer insulating film 104 similarly to the wiring layers 83 and the interlayer insulating film 84 described above.

In the example shown in FIG. 5, the multilayer wiring layer 102 of the pixel sensor substrate 12 includes the three wiring layers 103 and the multilayer wiring layer 82 of the logic substrate 11 includes the four wiring layers 83, but the total number of wiring layers is not limited to the above and an arbitrary number of layers can be formed.

In the silicon substrate 101, a photodiode 51 formed by PN junction is formed for each of the pixels 32.

Although not shown in the figure, at the multilayer wiring layer 102 and the silicon substrate 101, multiple pixel transistors such as the first transfer transistor 52 and the second transfer transistor 54, the memory section (MEM) 53 are also formed.

In a prescribed position of the silicon substrate 101 where the color filters 15 and the on-chip lenses 16 are not formed, a through-silicon via 109 connected to the wiring layer 103a of the pixel sensor substrate 12 and a through-chip via 105 connected to the wiring layer 83a of the logic substrate 11 are formed.

The through-chip via 105 and the through-silicon via 109 are connected by a connection wiring 106 formed on the top surface of the silicon substrate 101. In addition, an insulating film 107 is formed between each of the through-silicon via 109 and the through-chip via 105 and the silicon substrate 101. Furthermore, the color filters 15 and on-chip lenses 16 are formed on the upper surface of the silicon substrate 101 through an insulating film (planarization film) 108.

As described above, the laminated substrate 13 of the solid-state imaging device 1 shown in FIG. 1 is formed by putting together the side of the multilayer wiring layer 82 of the logic substrate 11 and the side of the multilayer wiring layer 102 of the pixel sensor substrate 12. In FIG. 5, the joint surface of the multilayer wiring layer 82 of the logic substrate 11 and the multilayer wiring layer 102 of the pixel sensor substrate 12 is indicated by the broken line.

In the laminated substrate 13 of the solid-state imaging device 1, the wiring layer 103 of the pixel sensor substrate 12 and the wiring layer 83 of the logic substrate 11 are connected by the two through vias, i.e., the through-silicon via 109 and the through-chip via 105, and the wiring layer 83 of the logic substrate 11 and the solder ball (backside electrode) 14 is connected by the through silicon via 88 and the rewiring 90. In this way, the flat area of the solid-state imaging device 1 can be reduced to the utmost limit.

Furthermore, the cavity-less structure is provided between the laminated substrate 13 and the glass protective substrate 18, and the glass sealing resin 17 is used to put these substrate together, so that the height can also be lowered.

Therefore, with the solid-state imaging device 1 shown in FIG. 1, a more compact semiconductor device (semiconductor package) can be realized.

<Enlarged Cross-Sectional View of the Glass Protective Substrate>

Figure 6:
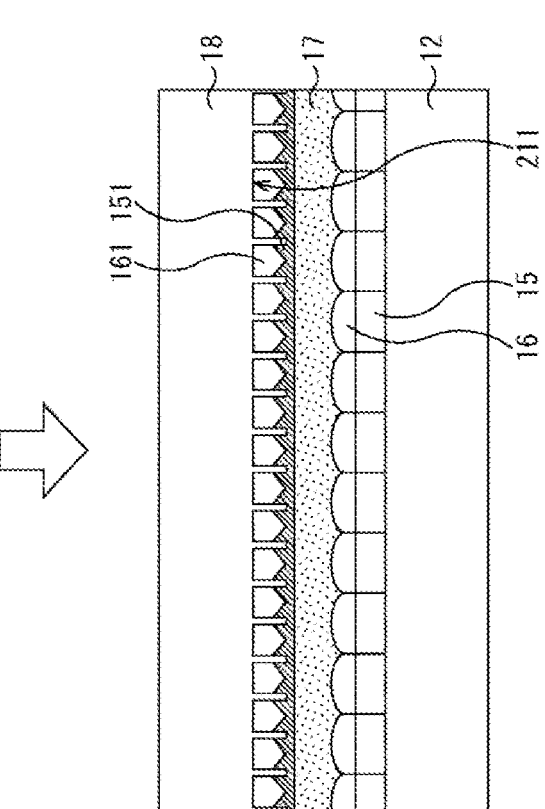
FIG. 6 is a cross-sectional view with an area near a glass protective substrate enlarged.

FIG. 6 is a partly enlarged cross-sectional view of the glass protective substrate 18.

Incident light enters the glass protective substrate 18 which is the uppermost surface of the solid-state imaging device 1 in the direction indicated by the arrow in FIG. 6. As shown in FIG. 6, a plurality of cavities 161 are formed at the surface (lower surface) opposed the light-incident surface as the upper surface of the glass protective substrate 18. The cavities 161 are hollow structures formed by sealing a plurality of openings 211 formed at a prescribed depth in the glass protective substrate 18 by a transparent film 151 and formed between the transparent film 151 and the glass protective substrate 18. The glass protective substrate 18 and the transparent film 151 form a transparent structure having the plurality of cavities 161.

The plurality of cavities 161 form an air gap on the surface of the glass protective substrate 18 on the side joined with the glass sealing resin 17. As a result, a layer with a reduced refractive index is formed on the side of the glass protective substrate 18 joined with the glass sealing resin 17.

Figure 7:
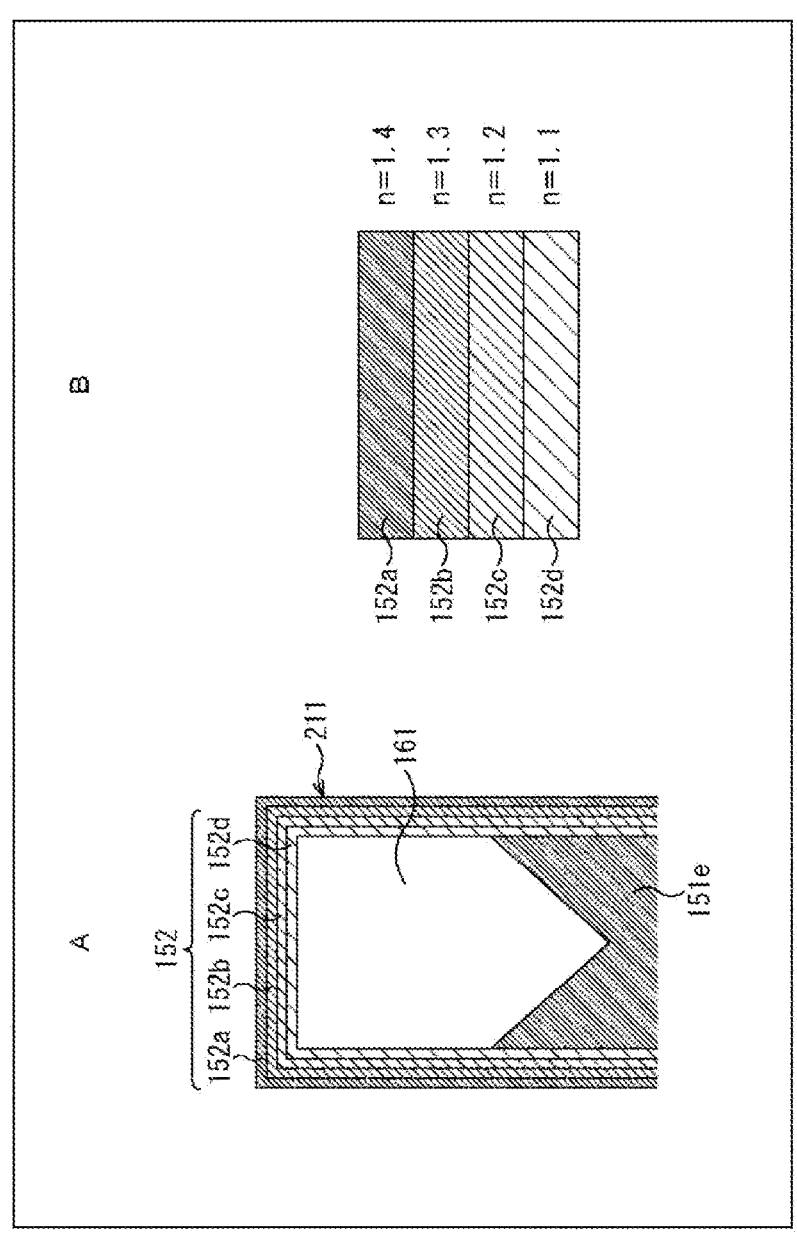
FIG. 7 is an enlarged cross-sectional view of one cavity.

FIG. 7 is an enlarged cross-sectional view of one of the cavities 161.

As shown in FIG. 7 at A, an anti-reflection film 152 including four layers of transparent films 152a to 152d placed upon each other are formed on the sides and bottom of the opening 211. The anti-reflection film 152 is formed by layering the transparent films 152a to 152d having different refractive indexes by Atomic Layer Deposition (ALD) before the openings 211 are sealed by the transparent film 151.

The transparent films 152a to 152d are made of materials having refractive indexes reduced in order of distance from the light-incident surface side. For example, as shown in FIG. 7 at B, the transparent films 152a to 152d have refractive indexes reduced by 0.1 from the refractive index (1.5) of the glass protective substrate 18 in the order, so that the layer closest to the cavity 161 has a refractive index from 1.1 to 1.2. The transparent film 151 that seals the opening 211 is formed for example by chemical vapor deposition (CVD) using an insulating film having a refractive index about from 1.4 to 1.5.

The transparent film 151 and the transparent films 152a to 152d are made of transparent films with desired refractive indexes, such as silicon oxide, silicon nitride, silicon oxynitride, silicon nitride carbide, aluminum oxide, aluminum nitride, aluminum oxide, titanium oxide, and tantalum oxide. According to the embodiment, silicon oxide (SiO2) is used as the material of the transparent film 151 and the transparent films 152a to 152d.

<Advantageous Effect of Hollow Structure>

Figure 8:
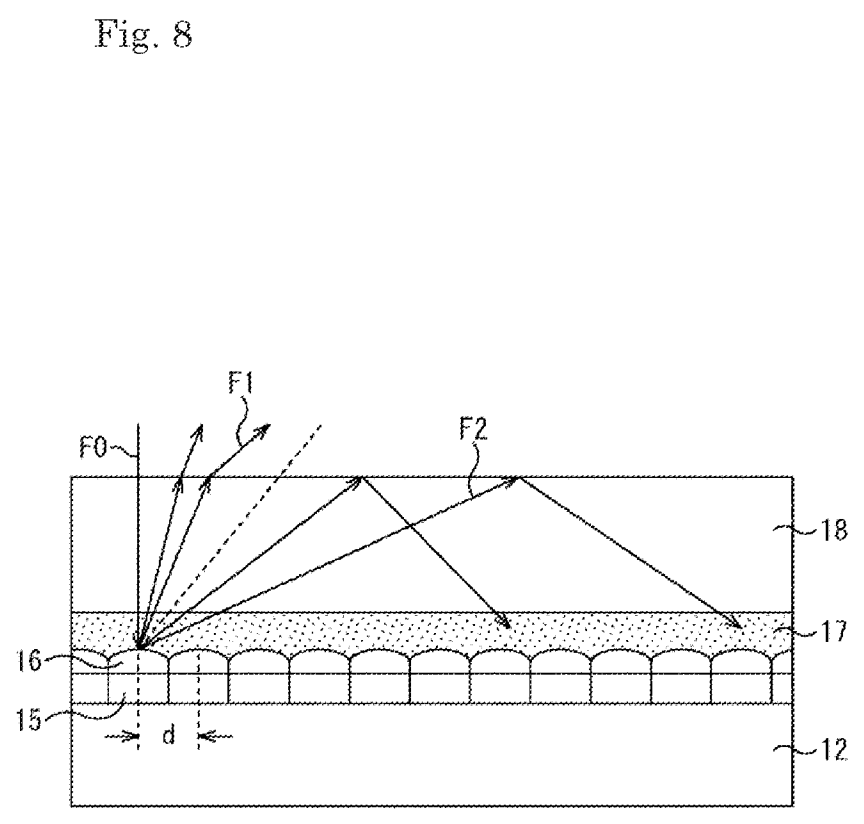
Figure 9:
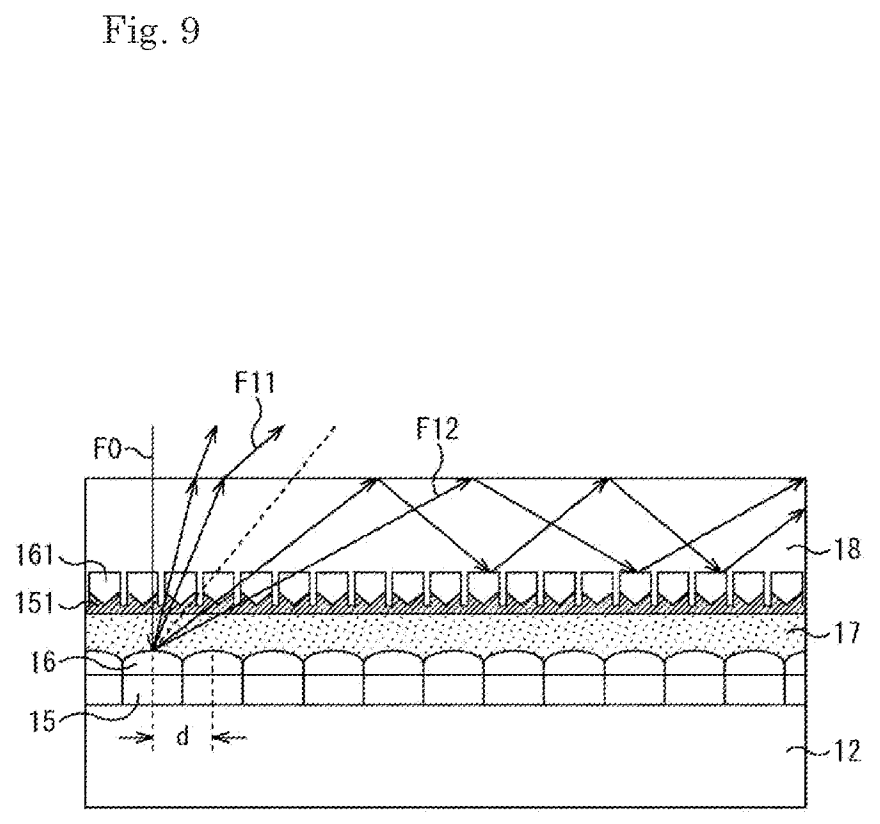
Figure 10:
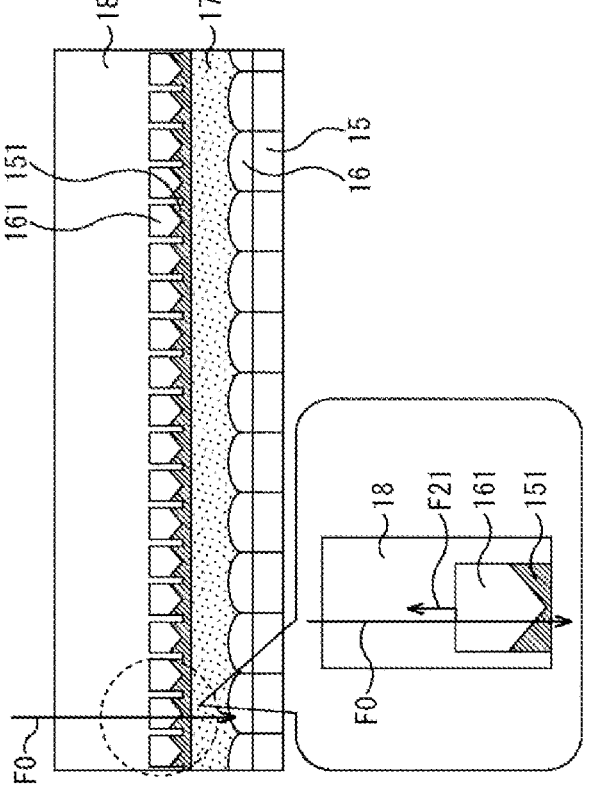
FIG. 10 is a view for illustrating an effect of an anti-reflection film.

With reference to FIGS. 8 to 10, an advantageous effect of the hollow structure including the plurality of cavities 161 formed in the glass protective substrate 18 will be described.

FIG. 8 is a cross-sectional view of the vicinity of the glass protective substrate 18 without the hollow structures.

As shown in FIG. 8, when the glass protective substrate 18 without the cavities 161 and the pixel sensor substrate 12 are joined in a cavity-less structure, and strong incident light F0 enters the substrates, the incident light F0 is partly reflected by the on-chip lens 16. The light reflected by the on-chip lens 16 includes m-th-order diffracted light. The m-th-order diffracted light is expressed by the following equation (1).

$$n \times \sin\ \theta = m\lambda/d \qquad (1)$$

In the equation, n is the refractive index of the glass sealing resin 17 (the refractive index of the glass protective substrate 18), θ is the reflection angle of the reflected light, m is the order, λ is the wavelength of the reflected light, and d is the distance between lenses.

Of the reflected light (diffracted light), reflected light F1, which is reflected light with a reflection angle smaller than the critical angle indicated by the broken line in FIG. 8, is emitted from the glass protective substrate 18. Meanwhile, reflected light F2, which is reflected light with a larger reflection angle than the critical angle, is totally reflected on the light-incident surface of the glass protective substrate 18, and reenters a pixel at a distance from the pixel to which the incident light F0 should be incident. In other words, in the cavity-less structure, the space between the glass protective substrate 18 and the pixel sensor substrate 12 is filled with the glass sealing resin 17 which has about the same refractive index as that of the glass protective substrate 18 with no gap, and therefore the reflected light that is totally reflected on the upper surface of the glass protective substrate 18 is not reflected from the interface between the glass protective substrate 18 and the glass sealing resin 17 but directly enters the pixel area 21 of the pixel sensor substrate 12. The re-entry of the reflected light F2 causes radial noise called a flare.

FIG. 9 is a cross-sectional view of the solid-state imaging device 1 including hollow structures of a plurality of cavities 161.

As shown in FIG. 9, in the solid-state imaging device 1, reflected light F11, which is reflected light with a reflection angle smaller than the critical angle, is emitted from the glass protective substrate 18. Reflected light F12, which is reflected light with a reflection angle larger than the critical angle, is repeatedly totally reflected at the light-incident surface of the glass protective substrate 18 and is totally reflected again at cavities 161.

Therefore, the cavities 161 can suppress the re-entry of reflected light reflected by the on-chip lenses 16. As a result, the solid-state imaging device 1 can operated with reduced flare generation.

In addition, since the cavities 161 can be formed in an area of the surface of glass protective substrate 18 about as thick as 1 μm, the solid-state imaging device 1 can have a reduced device thickness than the solid-state imaging device having a hollow structure between the on-chip lens 16 and the glass protective substrate 18 in order to reduce flare generation.

FIG. 10 is a view for illustrating an advantageous effect of the anti-reflection film 152.

When the incident light F0 enters the cavity 161 from the glass protective substrate 18, the difference between the refractive index (1.5) of the glass protective substrate 18 and the refractive index (1.0) of air enclosed in the cavity 161 is large, and therefore as shown in the balloon in FIG. 10, the incident light F0 may be partly reflected at the interface with the cavity 161 similarly to reflected light F21.

As described with reference to FIG. 7, in the solid-state imaging device 1, the side and bottom surfaces of the opening 211 are provided with the anti-reflection film 152. The anti-reflection film 152 includes layers of transparent films 152a to 152d placed upon each other to have refractive indexes reduced in order of distance from the light-incident surface side, and therefore the anti-reflection film 152 reduces reflection of incident light F0 as the light enters from the glass protective substrate 18 to the cavity 161.

Since the refractive index of the air enclosed in the cavity 161 is 1.0, and the refractive index of the transparent film 151 is from 1.4 to 1.5, the incident light F0 is not reflected upon entering the transparent film 151 from the cavity 161. Therefore, the incident light F0 that passes through the cavity 161 can enter the transparent film 151 without being reflected, even without forming an anti-reflection film between the transparent film 151 and the cavity 161.

<Exemplary Two-Stage Hollow Structure>

Figure 11:
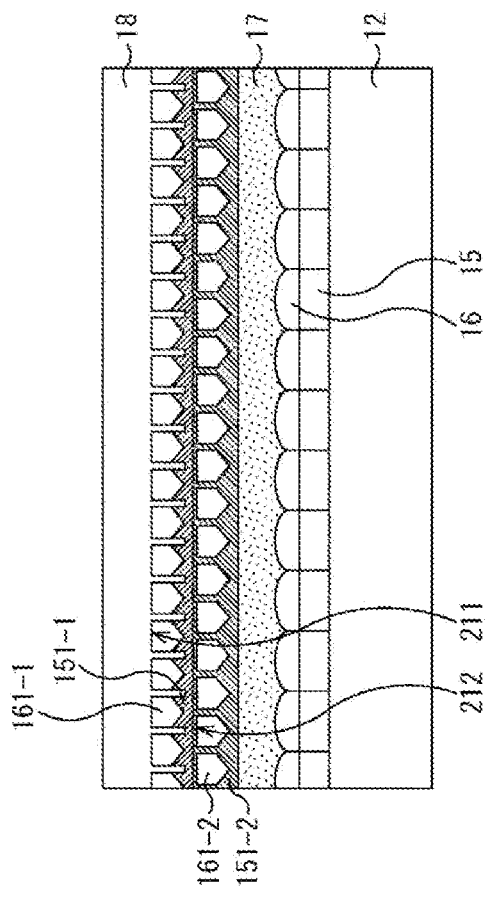
FIG. 11 is a cross-sectional view of an exemplary solid-state imaging device including a plurality of cavities formed in two stages.

FIG. 11 is a cross-sectional view of an exemplary solid-state imaging device 1 including a plurality of cavities 161 formed in two stages.

As shown in FIG. 11, a plurality of cavities 161-1 as a first stage and a plurality of cavities 161-2 as a second stage are formed on the surface of the glass protective substrate 18 opposed to the light-incident surface.

The cavities 161-1 are formed by sealing a plurality of openings 211 formed in the glass protective substrate 18 at a prescribed depth with the transparent film 151-1.

The cavities 161-2 are formed by sealing a plurality of openings 212 formed at a prescribed depth in the transparent film 151-1 in the first stage with the transparent film 151-2. The cavities 161-2 are formed to have at least an area to overlap the area where the cavities 161-1 are not formed when viewed in a plan view. The area of the first-stage cavity 161-1 and the area of the second-stage cavity 161-2 are shifted from each other, so that the entire pixel area can be covered by the plane region obtained by combining the openings 211 of the cavities 161-1 and the openings 212 of the cavities 161-2.

As described above, the cavities 161 in the two stages can be formed in the glass protective substrate 18. The number of stages is not limited to two but three or more stages may be formed. When multi-stage cavities 161 are formed, the area of the gap without a hollow space can be reduced, and the light totally reflected on the upper surface of the glass protective substrate 18 can be suppressed from reentering the pixels.

<2. Method for Forming Cavities>

Now, with reference to FIGS. 12 to 16, a method for forming the cavities 161-1 and 161-2 in the two stages in the glass protective substrates 18 will be described.

Figure 12:
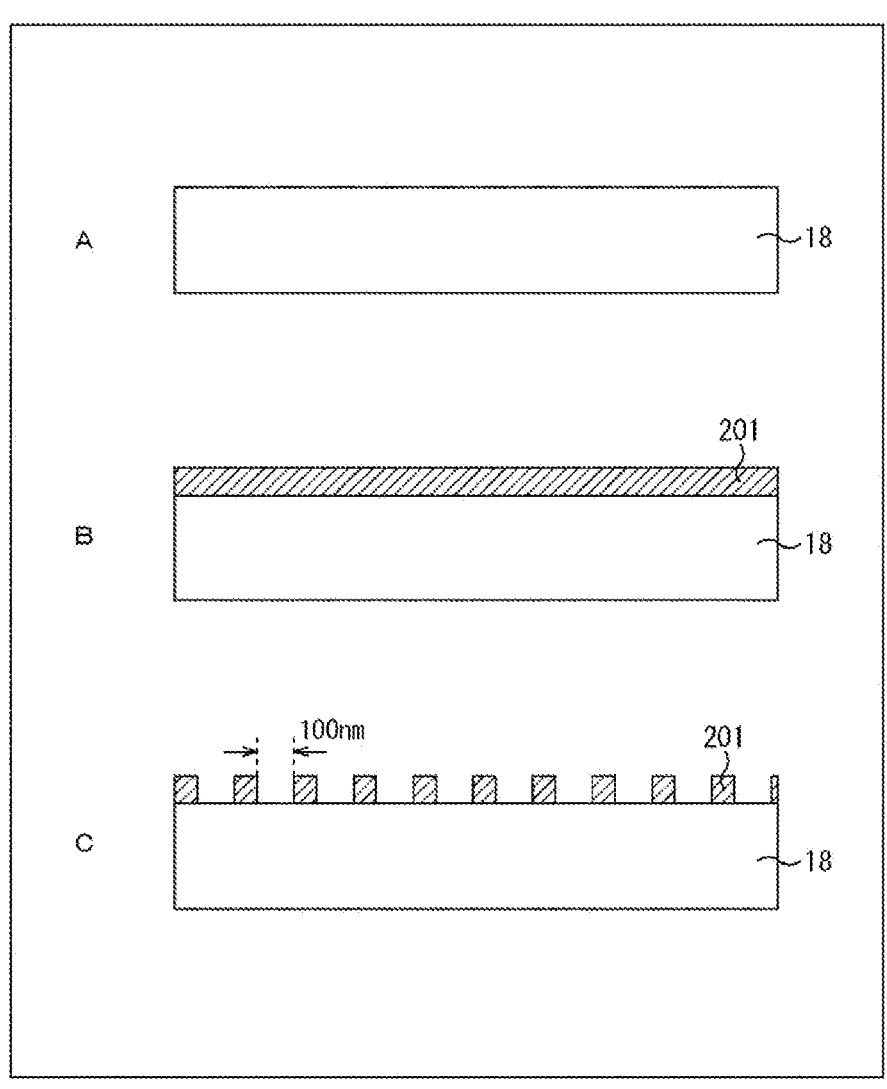
FIG. 12 is a view for illustrating a method for forming cavities in two stages in a glass protective substrate.

To start with, the glass protective substrate 18 is prepared as shown in FIG. 12 at A. In FIG. 12, the upper side corresponds to the side of the glass sealing resin 17. The same applies to FIGS. 13 and 15.

Then, as shown in FIG. 12 at B, photoresist 201 is applied on the glass protective substrate 18.

Then, as shown in FIG. 12 at C, the photoresist 201 is patterned according to the area where openings 211 are to be formed. For example, a pattern having spaces with a width of 100 nm arranged at intervals is formed. The width of the opening 211 is preferably about in the range from 100 nm to 200 nm.

Figure 13:
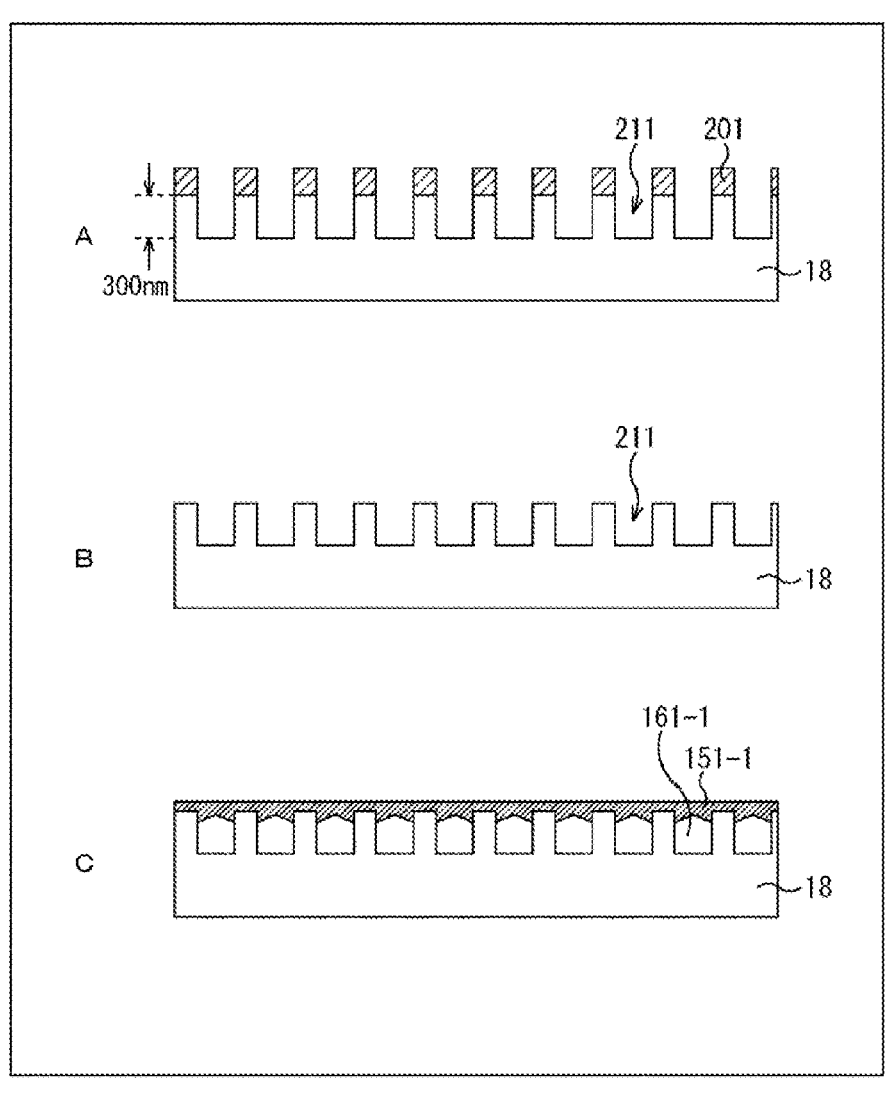
FIG. 13 is a view for illustrating a method for forming cavities in two stages in a glass protective substrate.

Then, as shown in FIG. 13 at A, a plurality of openings 211 are formed in the glass protective substrate 18 by dry etching performed with plasma and gas using the photoresist 201 as a mask. Dry etching is performed for example until the depth of the openings 211 is about 300 nm, and the openings 211 are formed to have for example a rectangular cross-sectional shape. The depth of the opening 211 is preferably about in the range from 200 nm to 300 nm.

Any gas that can etch the glass protective substrate 18 can be used for dry etching, and for example a fluorocarbon (CF4) based gas can be used. Instead of dry etching, wet etching may be carried out so that isotropically spreading openings 211 are formed.

Then, the photoresist 201 is removed by ashing and cleaning as shown in FIG. 13 at B.

Figure 14:
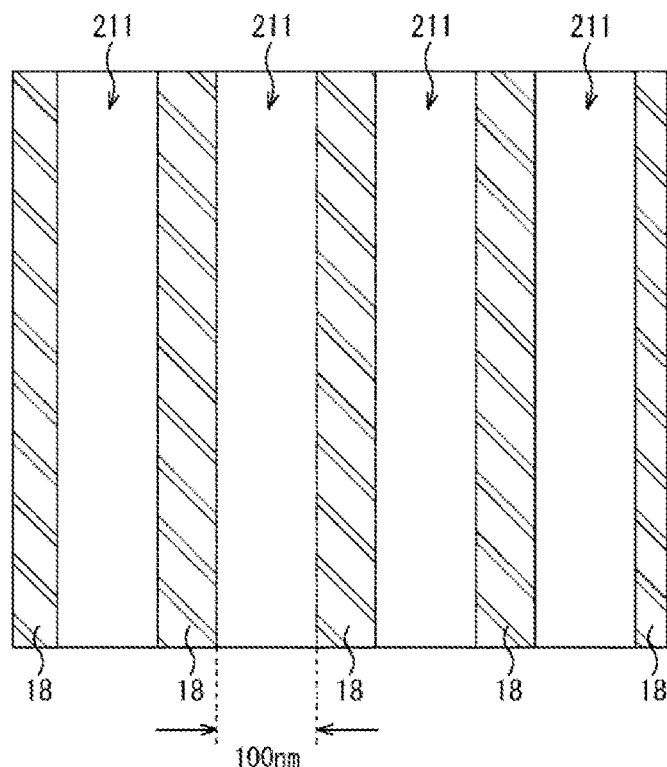
FIG. 14 is a plan view of an exemplary pattern of openings.

FIG. 14 is a plan view of the glass protective substrate 18 in FIG. 13 at B, viewed from above. In FIG. 14, the pillar part has a pattern (is hatched) to distinguish between the area with openings 211 and the area of the pillar parts therebetween. FIGS. 13 and 14 are drawn to different scales.

As shown in FIG. 14, the openings 211 are formed in the shapes of vertical stripes (lines) in a plan view. Here, the opening 211 has a width of 100 nm.

After the removal of the photoresist 201 as shown in FIG. 13 at B, the anti-reflection film 152 is formed on the side and bottom surfaces of the openings 211 as described with reference to FIG. 7 for example by an ALD method. Specifically, a transparent film 152a is deposited using SiO2 with a refractive index of 1.4. Then, a transparent film 152b is deposited using SiO2 with a reduced density and a refractive index of 1.3. Then, a transparent film 152c is deposited using porous SiO2 with a refractive index of 1.2, and a transparent film 152d is deposited using porous SiO2 with a refractive index of 1.1. The anti-reflection film 152 is formed by layering the transparent films 152a to 152d. The transparent films 152a to 152d each have a thickness of about 20 nm.

Then, as shown in FIG. 13 at C, a transparent film 151-1 of SiO2 is formed for example by plasma chemical vapor deposition (CVD), so that the openings 211 are sealed, and cavities 161-1 are formed.

When only the first-stage cavities 161-1 are formed in the glass protective substrate 18, the glass protective substrate 18 shown in FIG. 13 at C is inverted and joined to the laminated substrate 13 through the glass sealing resin 17.

Figure 15:
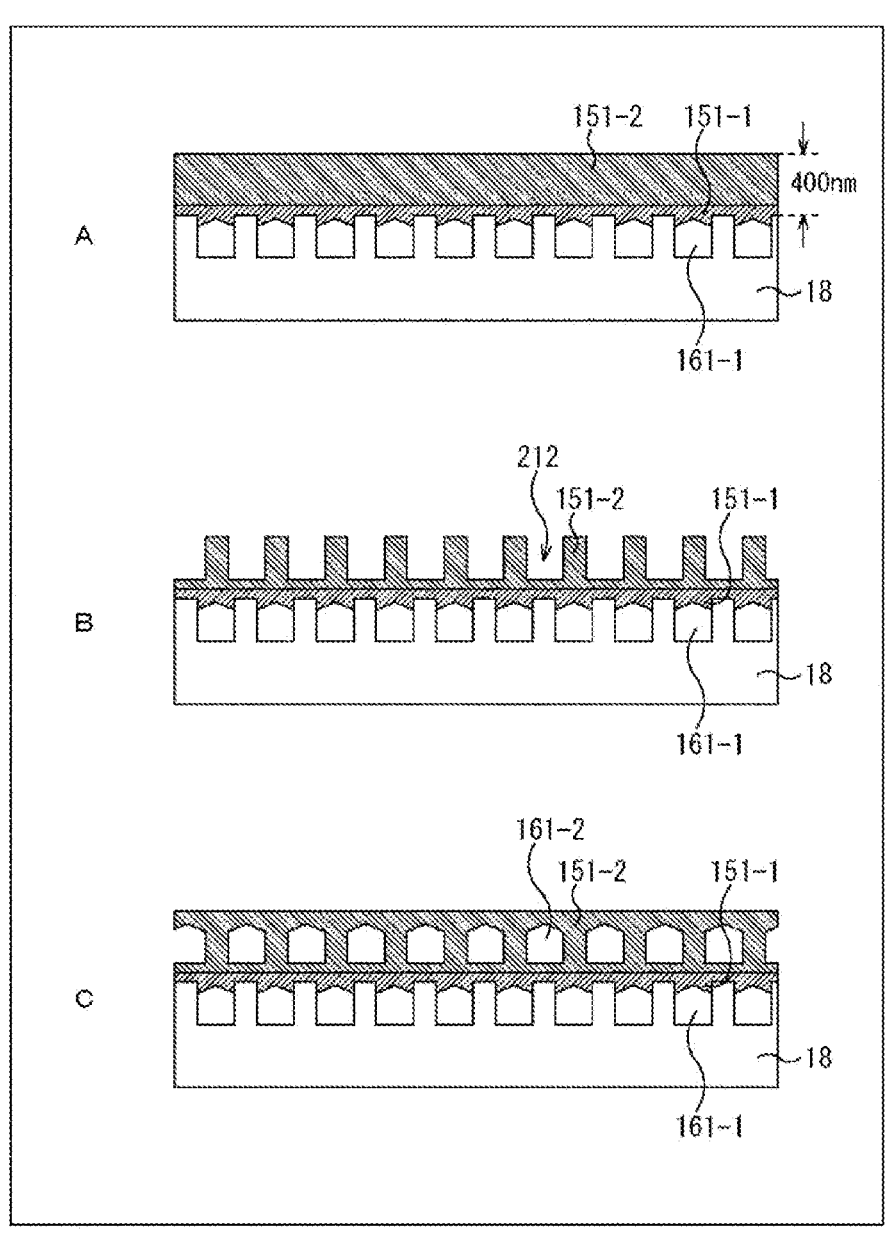
FIG. 15 is a view for illustrating a method for forming cavities in two stages in a glass protective substrate.

When the cavities 161-2 in the second stage are further formed in the glass protective substrate 18, the transparent film 151-2 is formed for example by ALD using SiO2 as shown in FIG. 15 at A. Here, the deposition amount is increased in depositing the transparent film 151-1 described with reference to FIG. 13 at C, so that the transparent film 151-2 is formed together with the transparent film 151-1. The combined thickness of the sealed surface of the transparent film 151-1 and the transparent film 151-2 is preferably about in the range from 300 nm to 400 nm, for example 400 nm.

After the transparent film 151-2 is formed, the surface of the transparent film 151-2 is polished and planarized for example by chemical mechanical polish (CMP).

Then, the same procedure as that for forming the openings 211 of the cavities 161-1 is performed, and openings 212 are formed in the transparent film 151-2 as shown in FIG. 15 at B.

Figure 16:
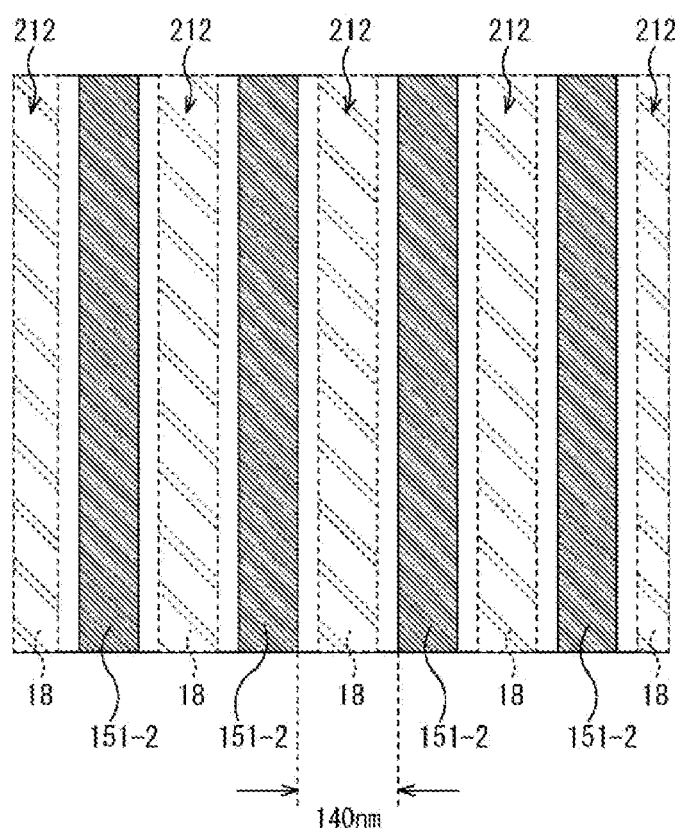
FIG. 16 is a plan view of an exemplary pattern of openings.

FIG. 16 is a plan view of the glass protective substrate 18 in FIG. 15 at B, viewed from above.

As shown in FIG. 16, the openings 212 are formed in a vertical stripe pattern similarly to the first-stage openings 211 shown in FIG. 14. The opening 212 has for example an opening width of 140 nm which is larger than that of the opening 211. The openings 212 are positioned in the horizontal direction so that the pillar parts between the openings 211 in the first stage are included at least in the openings 212. In FIG. 16, the areas of the pillar parts between openings 211 patterned in FIG. 14 are indicated by the broken lines in the same pattern.

In this way, the arrangement of the openings 211 in the first stage and the arrangement of the openings 212 in the second stage are different, so that the entire flat area of the glass protective substrate 18 may be configured to have one kind of the hollow structures. The opening width of the multi-stage cavities 161 can be the same or different among the stages. When the width is varied between the stages, it does not matter whether the upper or lower stage has a larger or smaller width.

In FIGS. 14 and 16, the openings 211 and 212 are formed in a vertical stripe pattern, but the direction of extension of the openings 211 and 212 is not particularly restricted and can be optimized in combination with the pixel structure.

Although not shown, after the openings 212 are formed, an anti-reflection film 152 is deposited for example by ALD on the sides and bottom surfaces of the openings 212 in the same manner as in the first stage.

Then, as shown in FIG. 15 at C, the openings 212 are sealed by depositing a transparent film 151-2 of SiO2 for example by plasma CVD, and cavities 161-2 are formed.

In this manner, the glass protective substrate 18 having the cavities 161-1 and 161-2 is formed. The completed glass protective substrate 18 is inverted and the surface having the cavities 161-1 and 161-2 is joined to the laminated substrate 13 with the glass sealing resin 17.

After the entire surface of the glass protective substrate 18 having the cavities 161-1 and 161-2 is joined to the laminated substrate 13 with the glass sealing resin 17, the through silicon via 88, the connecting conductor 87, the rewiring 90, and the like shown in FIG. 5 are formed at the backside of the solid-state imaging device 1 on the opposite side to the glass protective substrate 18 using the glass protective substrate 18 as a support substrate. Therefore, the through-silicon via 88, the connecting conductor 87, the rewiring 90, and the like on the backside can be easily formed by wafer level process.

<3. Other Exemplary Patterns of Openings>

According to the above-described embodiment, the openings 211 and 212 are extended in the same direction, but the openings 211 and 212 can be extended in different directions. For example, the extending direction of the line-shaped openings 211 may be orthogonal to the extending direction of the line-shaped openings 212.

Figure 17:
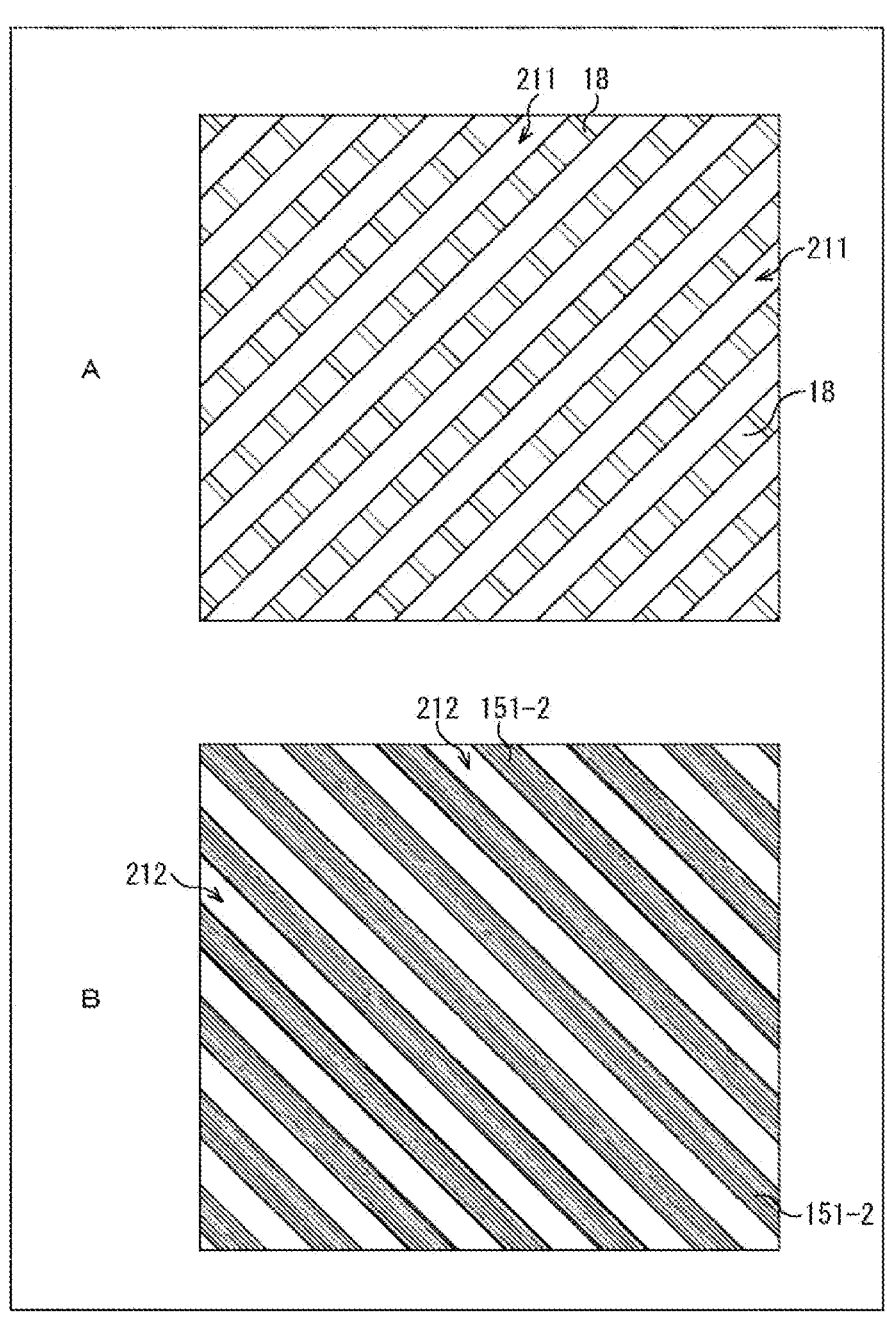
FIG. 17 is a plan view of another exemplary pattern of openings.

FIG. 17 is a plan view of another exemplary pattern of the openings 211 and 212. The patterns representing the irregularities of the openings 211 and 212 correspond to those in FIGS. 14 and 16.

FIG. 17 at A shows an exemplary pattern of the openings 211 corresponding to the cavities 161-1 in the first stage. In FIG. 17 at A, the glass protective substrate 18 is etched, so that the openings 211 are formed in an upward right line pattern. Here, etching is performed so that the opening 211 has a depth of for example 200 nm.

FIG. 17 at B shows an exemplary pattern of the openings 212 corresponding to the cavities 161-2 in the second stage. In FIG. 17 at B, the transparent film 151-2 is etched, so that the openings 212 are formed in an upward left line pattern. Here, for example, the transparent films 151-1 and 151-2 of SiO2 with a thickness of 300 nm are deposited and etching is performed so that the openings 212 have a depth of 200 nm.

Figure 18:
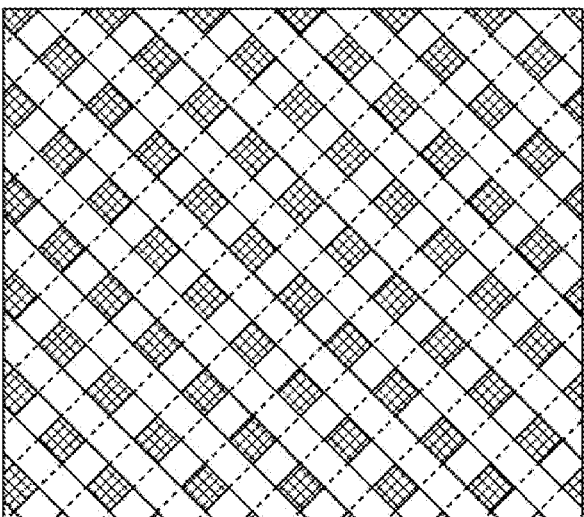
FIG. 18 is a plan view of a pattern including patterns of openings in FIG. 17 placed upon each other.

FIG. 18 is a plan view of a pattern including the pattern of the openings 211 and the pattern of the openings 212 in FIG. 17 placed on each other.

As shown in FIG. 18, when the pattern of the openings 211 shown in FIG. 17 at A and the pattern of the openings 212 shown in FIG. 17 at B are superimposed, non-hollow portions where none of the openings 211 and 212 are formed are formed. In FIG. 18, the non-hollow portions are indicated by rectangular areas in a grid pattern.

When the patterns of openings 211 and 212 in FIGS. 17 and 18 are used, the cavities 161 are formed in the glass protective substrate 18, and therefore, flare generation can be reduced as described with reference to FIG. 9.

As described with reference to FIG. 18, there are areas in the glass protective substrate 18 where no hollow portion is formed in a plan view, the strength of the glass protective substrate 18 can be increased by forming such areas with no hollow portion.

For the area where no hollow portions are formed even with the cavities 161 in the first and second stages, third-stage cavities 161 may be formed to cover the area with no hollow portions in a plan view. For example, the openings corresponding to the third-stage cavities 161 may be formed in a line shape pattern that overlaps the area without any of the openings 211 and 212 in a plan view.

The cavities 161 in the third stage may be formed together with the cavities 161-1 and 161-2 in the two stages, so that the strength of the glass protective substrate 18 can be maintained, while a hollow structure that covers the entire glass protective substrate 18 in a plan view can be formed.

<4. Further Exemplary Patterns of Openings>

The pattern of openings formed when forming a multi-stage cavities 161 is not only a line pattern but also any of other patterns may be used.

Figure 19:
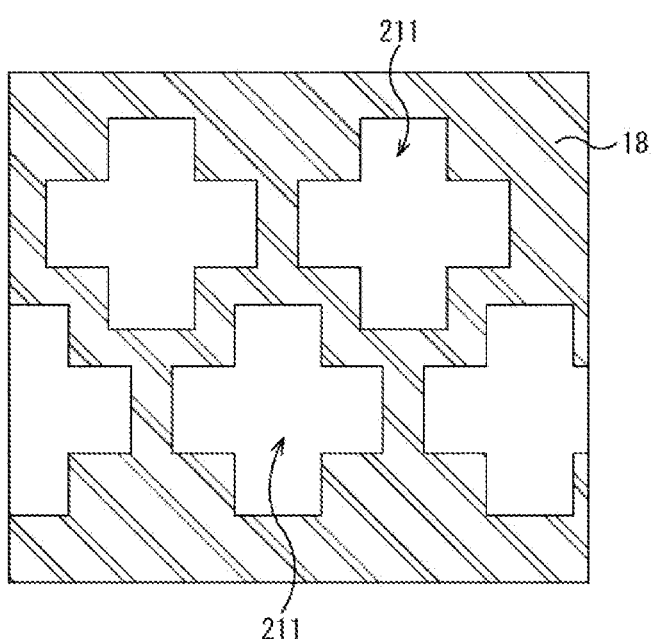
FIG. 19 is a view of yet another exemplary pattern of openings.

FIG. 19 is a view of yet another exemplary pattern of openings 211.

As shown in FIG. 19, the openings 211 are formed in a cross-shaped pattern by etching the glass protective substrate 18. In FIG. 19, the cross-shaped openings 211 formed at the glass protective substrate 18 are arranged at prescribed intervals.

For example, the cross-shaped openings 211 are sealed with the transparent film 151 to form cavities 161 in three stages. The cavities 161 in the three stages have areas with hollow portions shifted from each other. This allows the hollow portions to be formed to cover the entire glass protective substrate 18 in a plan view.

As described above, the pattern of the openings to form the cavities 161 in each stage can be freely drawable.

<5. Modifications>

Figure 20:
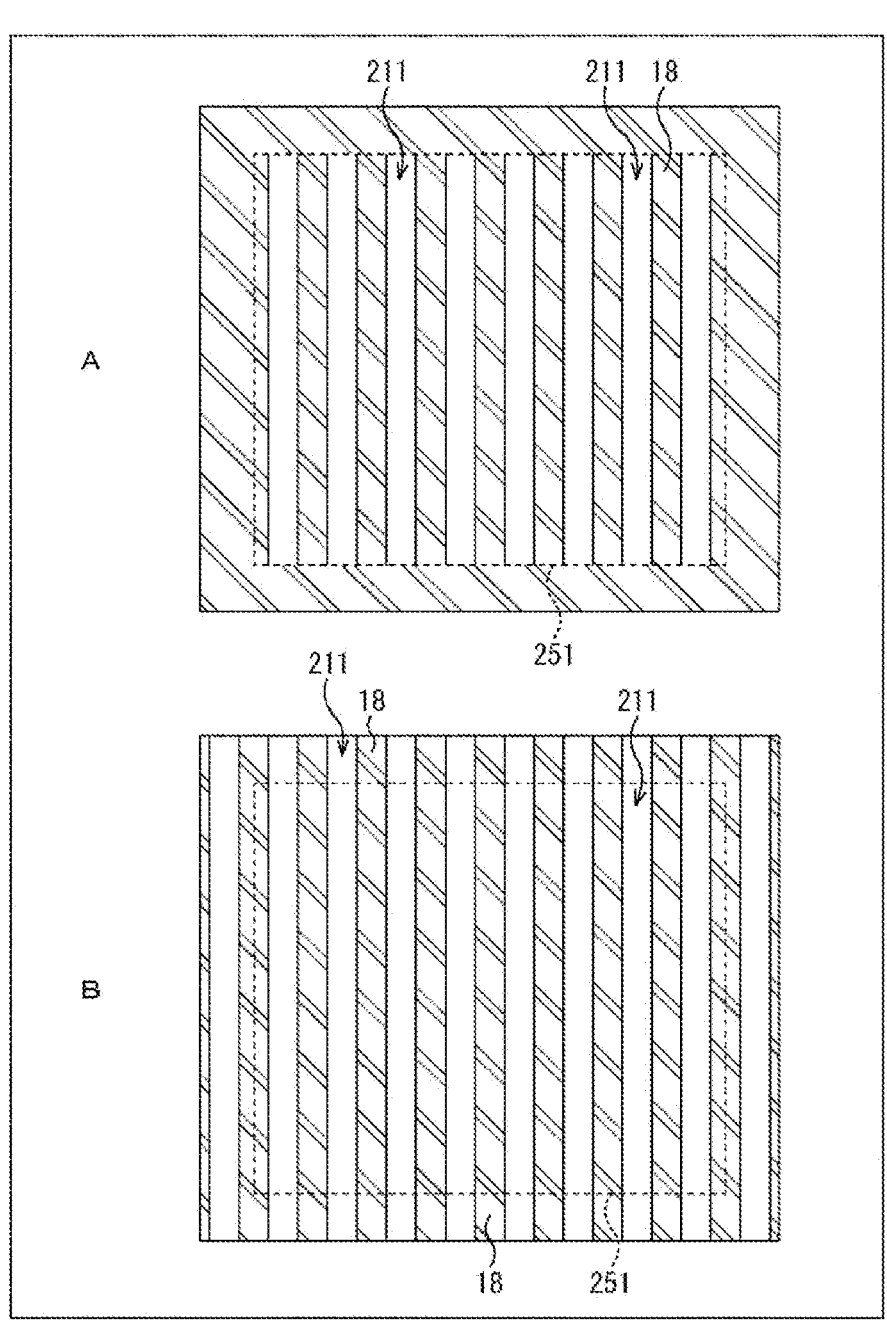
FIG. 20 is a plan view of an exemplary region where cavity openings are formed.

FIG. 20 is a plan view of an exemplary area where the openings 211 of the cavities 161 are formed for the entire plan area of glass protective substrate 18.

In FIG. 20 at A, the openings 211 are formed only in the pixel upper area 251 of the glass protective substrate 18 corresponding to the pixel area 21. The pixel upper area 251 corresponds to the area inside the rectangular area indicated by the broken line. No opening 211 is formed in the pixel peripheral area outside the pixel upper area 251 in the glass protective substrate 18.

Meanwhile, in FIG. 20 at B, openings 211 are formed not only in the pixel upper area 251 but also in the entire glass protective substrate 18 including the pixel peripheral area outside the pixel upper area.

In this way, the flat area where the plurality of cavities 161 are formed may be only the pixel upper area 251 corresponding to the pixel area 21 or the entire area of the glass protective substrate 18. The same applies the multiple-stage cavities 161.

Figure 21:
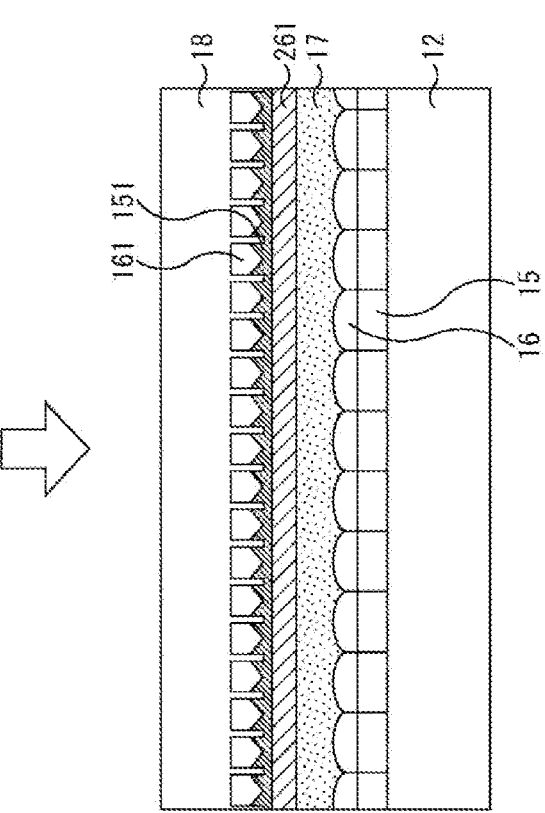
FIG. 21 is a partly enlarged cross-sectional view of another exemplary configuration of the solid-state imaging device.

FIG. 21 is a partly enlarged cross-sectional view of another exemplary configuration of the solid-state imaging device 1 and corresponds to FIG. 6.

In FIG. 21, a correction film 261 is newly formed between the transparent film 151 and the glass sealing resin 17 to suppress warpage of the glass protective substrate 18. For example, silicon nitride can be used as the material for the correction film 261. In this way, warpage of the glass protective substrate 18 can be reduced.

The correction film 261 may be formed on the light-incident surface side of the glass protective substrate 18 rather than between the transparent film 151 and the glass sealing resin 17.

Figure 22:
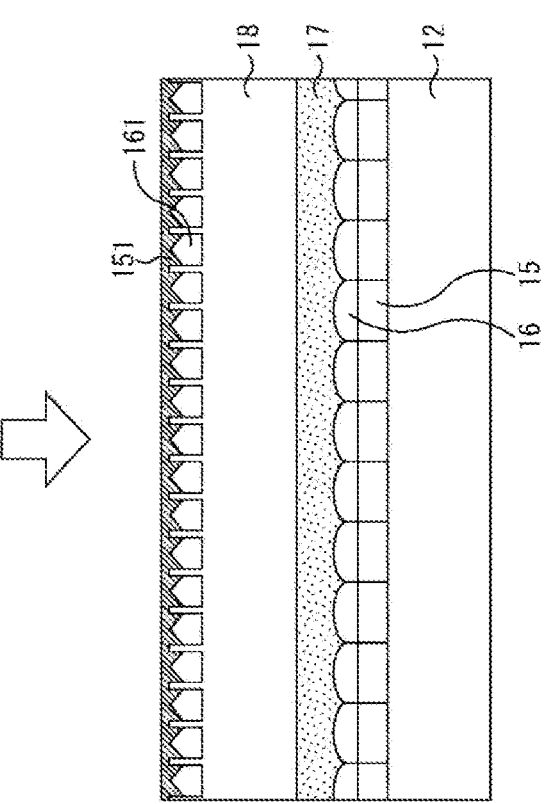
FIG. 22 is a partly enlarged cross-sectional view of yet another exemplary configuration of the solid-state imaging device.

FIG. 22 is a partly enlarged cross sectional view of yet another exemplary configuration of the solid-state imaging device 1 and corresponds to FIG. 6.

In FIG. 22, the plurality of cavities 161 are formed not on the side of the on-chip lens 16, which is the joint surface with the glass sealing resin 17, but on the light incident surface side of the glass protective substrate 18. In this case, the glass protective substrate 18 completed in FIG. 15 at C is not inverted, and needs only be joined to the laminated substrate 13 with the glass sealing resin 17 while keeping the surface having the cavities 161 formed thereon as the upper side.

In this way, the plurality of cavities 161 may be formed either on the light-incident surface of the glass protective substrate 18 or on the surface opposed to the light-incident surface. The same applies to the case where cavities 161 are formed in multiple stages.

<6. Exemplary Application to Electronic Devices>

The solid-state imaging device 1 described above can be applied to various electronic devices such as an imaging device such as a digital still camera and a digital video camera, a cellular phone having an imaging function, or any other device having an imaging function.

Figure 23:
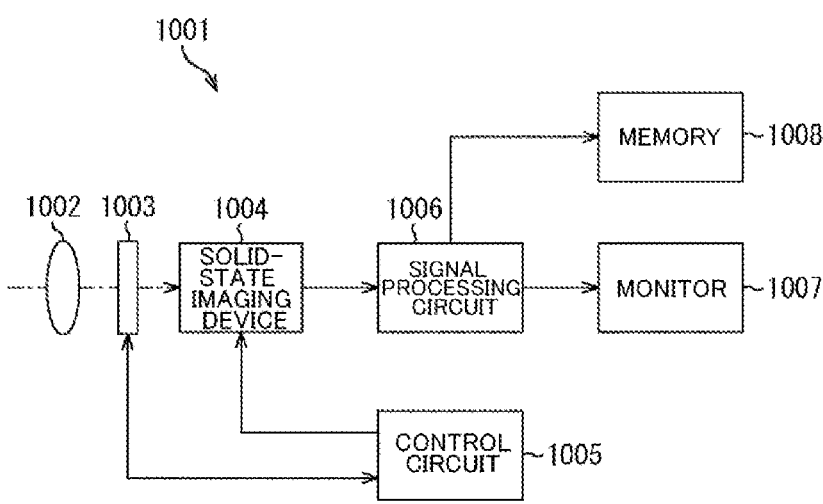
FIG. 23 is a block diagram of an exemplary configuration of an imaging device as an electronic device to which the feature of the present disclosure is applied.

FIG. 23 is a block diagram of an exemplary configuration of an imaging device as an electronic device to which the present disclosure is applied.

The imaging apparatus 1001 shown in FIG. 23 includes an optical system 1002, a shutter device 1003, a solid-state imaging device 1004, a drive circuit 1005, a signal processing circuit 1006, a monitor 1007, and a memory 1008 and can capture still images and moving images.

The optical system 1002 includes one or more lenses and directs light from an object (incident light) to the solid-state imaging device 1004 and forms an image on the light-receiving surface of the solid-state imaging device 1004.

The shutter device 1003 is arranged between the optical system 1002 and the solid-state imaging device 1004, and controls a light emission period and a light shielding period for the solid-state imaging device 1004 according to control by the drive circuit 1005.

The solid-state imaging device 1004 is identical to the solid-state imaging device 1 shown in FIG. 1. The solid-state imaging device 1004 accumulates signal charges for a certain period according to light formed into an image on the light receiving surface via the optical system 1002 and the shutter device 1003. The signal charge accumulated in the solid-state imaging device 1004 is transferred according to the drive signal (timing signal) supplied from the drive circuit 1005.

The drive circuit 1005 outputs a drive signal that controls the transfer operation of the solid-state imaging device 1004 and the shutter operation of the shutter device 1003, and drives the solid-state imaging device 1004 and the shutter device 1003.

The signal processing circuit 1006 performs various types of signal processing on the signal charge output from the solid-state imaging device 1004. The image (image data) obtained by signal processing performed by the signal processing circuit 1006 is supplied to and displayed on the monitor 1007, and supplied and stored (recorded) in the memory 1008.

The solid-state imaging device 1 in FIG. 1 and other figures can be used as the solid-state imaging device 1004 in the imaging apparatus 1001 having the above-described configuration, so that the apparatus can be compact or have a reduced height and can reduce flare generation. In this way, high quality captured images can be obtained.

<7. Exemplary Use of Solid-State Imaging Device>

Figure 24:
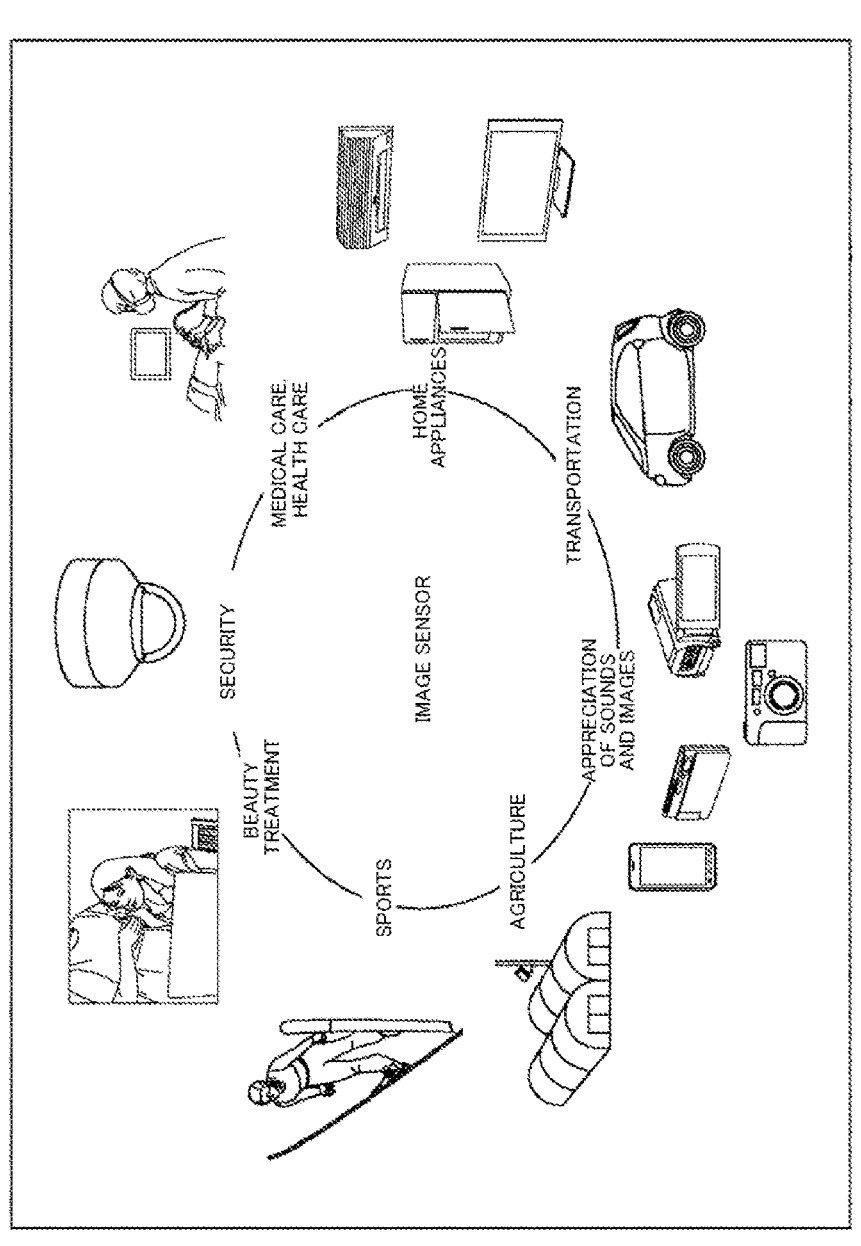
FIG. 24 illustrates examples of how a solid-state imaging device is used.

FIG. 24 is a view of examples of how the solid-state imaging device 1 is used.

The above-mentioned imaging device 1 can be used in various cases for sensing light such as visible light, infrared light, ultraviolet light, and X-ray, as will be described.

- Devices that capture images used for viewing, such as digital cameras and mobile apparatuses with camera functions
- Devices used for transportation, such as in-vehicle sensors that capture front, rear, surrounding, and interior view images of automobiles, monitoring cameras that monitor traveling vehicles and roads, ranging sensors that measure a distance between vehicles, and the like, for safe driving such as automatic stop, recognition of a driver's condition, and the like
- Devices used for home appliances such as TVs, refrigerators, and air conditioners in order to photograph a user's gesture and perform device operations in accordance with the gesture
- Devices used for medical treatment and health care, such as endoscopes and devices that perform angiography by receiving infrared light
- Devices used for security, such as monitoring cameras for crime prevention and cameras for personal authentication
- Devices used for beauty, such as a skin measuring device that captures images of the skin and a microscope that captures images of the scalp
- Devices used for sports, such as action cameras and wearable cameras for sports applications
- Devices used for agriculture, such as cameras for monitoring conditions of fields and crops <8. Exemplary Application to Endoscopic Operation System>

The feature of the present disclosure (the present feature) can be applied to various products. For example, the feature according to the present disclosure may be applied to an endoscopic operation system.

Figure 25:
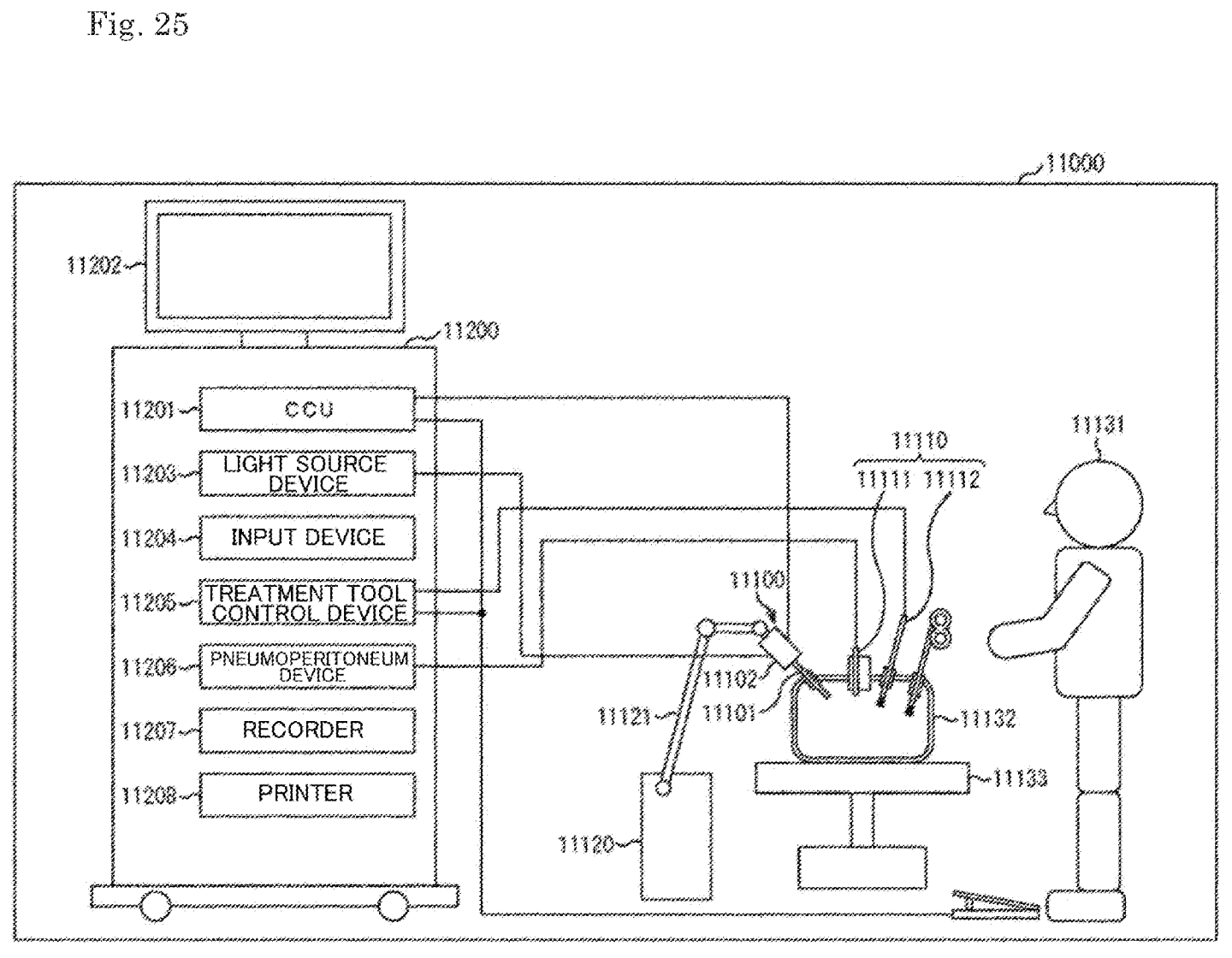

FIG. 25 is a diagram for illustrating an example of a schematic configuration of an endoscopic operation system to which the feature according to the present disclosure (the present feature) is applied.

FIG. 25 shows a state where an operator (doctor) 11131 is using an endoscopic operation system 11000 to perform a surgical operation on a patient 11132 on a patient bed 11133. As illustrated, the endoscopic operation system 11000 includes an endoscope 11100, another surgical instrument 11110 such as a pneumoperitoneum tube 11111 or an energized treatment tool 11112, a support arm apparatus 11120 that supports the endoscope 11100, and a cart 11200 mounted with various apparatuses for endoscopic operation.

The endoscope 11100 includes a lens barrel 11101 of which a region having a predetermined length from a tip thereof is inserted into a body cavity of the patient 11132, and a camera head 11102 connected to a base end of the lens barrel 11101. In the illustrated example, the endoscope 11100 configured as a so-called rigid endoscope having the rigid lens barrel 11101 is illustrated, but the endoscope 11100 may be configured as a so-called flexible endoscope having a flexible lens barrel.

The distal end of the lens barrel 11101 is provided with an opening into which an objective lens is fitted. A light source device 11203 is connected to the endoscope 11100, light generated by the light source device 11203 is guided to the distal end of the lens barrel 11101 by a light guide extended to the inside of the lens barrel 11101, and the light is radiated toward an observation target in the body cavity of the patient 11132 through the objective lens. The endoscope 11100 may be a direct-viewing endoscope, an oblique-viewing endoscope, or a side-viewing endoscope.

An optical system and an imaging element are provided inside the camera head 11102 and light (observation light) reflected from the observation target is focused on the imaging element by the optical system. The observation light is photoelectrically converted by the imaging element, and an electrical signal corresponding to the observation light, that is, an image signal corresponding to an observation image is generated. The image signal is transmitted to a camera control unit (CCU) 11201 as RAW data.

The CCU 11201 is configured of a central processing unit (CPU), a graphics processing unit (GPU) or the like, and controls operations of the endoscope 11100 and a display device 11202 in an integrated manner. Further, the CCU 11201 receives the image signal from the camera head 11102 and performs various image processing such as development processing (demosaic processing) on the image signal for displaying an image based on the image signal.

The display device 11202 displays the image based on the image signal subjected to the image processing by the CCU 11201 under the control of the CCU 11201.

The light source device 11203 includes a light source such as a light emitting diode (LED) and supplies the endoscope 11100 with irradiation light for imaging a surgical site or the like.

The input device 11204 is an input interface for the endoscopic operation system 11000. The user can input various types of information or instructions to the endoscopic operation system 11000 via the input device 11204. For example, the user inputs an instruction to change imaging conditions (a type of irradiation light, a magnification, a focal length, or the like) of the endoscope 11100.

A treatment tool control device 11205 controls driving of the energized treatment tool 11112 for cauterization or incision of a tissue, sealing of blood vessel, or the like. A pneumoperitoneum device 11206 sends a gas into the body cavity of the patient 11132 via the pneumoperitoneum tube 11111 in order to inflate the body cavity for the purpose of securing a field of view using the endoscope 11100 and a working space of the surgeon. A recorder 11207 is a device capable of recording various types of information on surgery. A printer 11208 is a device capable of printing various types of information on surgery in various formats such as text, images, and graphs.

The light source device 11203 that supplies the endoscope 11100 with irradiation light when photographing a surgical site can be constituted of, for example, an LED, a laser light source, or a white light source constituted of a combination thereof. When the white light source is constituted of a combination of RGB laser light sources, since an output intensity and an output timing of each color (each wavelength) can be controlled with high accuracy, the light source device 11203 can adjust white balance of a captured image. In addition, in this case, by irradiating an observation target with laser light from each of the RGB laser light sources in a time-shared manner and controlling driving of the imaging element of the camera head 11102 in synchronization with the irradiation timing, it is also possible to capture images respectively corresponding to RGB in a time-shared manner. According to this method, it is possible to obtain a color image without providing a color filter in the imaging element.

Further, driving of the light source device 11203 may be controlled so that an intensity of output light is changed at predetermined time intervals. The driving of the imaging element of the camera head 11102 is controlled in synchronization with a timing of changing the intensity of the light, and images are acquired in a time division manner and combined, such that an image having a high dynamic range without so-called blackout and whiteout can be generated.

Further, the light source device 11203 may be configured to be able to supply light having a predetermined wavelength band corresponding to special light observation. In the special light observation, for example, so-called narrow band imaging in which a predetermined tissue such as a blood vessel of a mucosal surface layer is imaged with high contrast through irradiation with light in a narrower band than irradiation light (that is, white light) at the time of normal observation using a dependence of absorption of light in a body tissue on a wavelength is performed. Alternatively, in the special light observation, fluorescence observation in which an image is obtained using fluorescence generated through excitation light irradiation may be performed. In the fluorescence observation, a body tissue can be irradiated with excitation light and fluorescence from the body tissue can be observed (autofluorescence observation), or a reagent such as indocyanine green (ICG) can be locally injected into a body tissue and the body tissue can be irradiated with excitation light corresponding to a fluorescence wavelength of the reagent so that a fluorescence image is obtained. The light source device 11203 can be configured to be able to supply narrowband light and/or excitation light corresponding to such special light observation.

Figure 26:
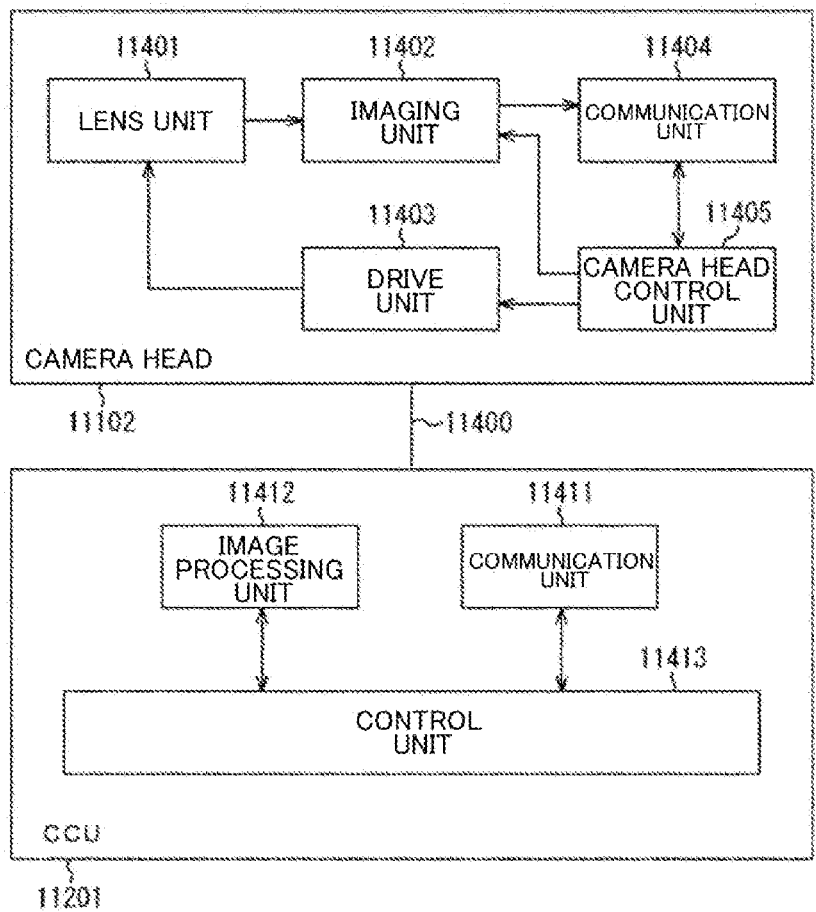
FIG. 26 is a block diagram of an exemplary functional configuration of a camera head and a CCU.

FIG. 26 is a block diagram showing an example of functional configurations of the camera head 11102 and the CCU 11201 shown in FIG. 25.

The camera head 11102 includes a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicatively connected to each other by a transmission cable 11400.

The lens unit 11401 is an optical system provided in a connection portion for connection to the lens barrel 11101. Observation light taken from a tip of the lens barrel 11101 is guided to the camera head 11102 and is incident on the lens unit 11401. The lens unit 11401 is configured in combination of a plurality of lenses including a zoom lens and a focus lens.

The number of imaging elements constituting the imaging unit 11402 may be one (so-called single-plate type) or may be plural (so-called multi-plate type). When the imaging unit 11402 is configured in a multi-plate type, for example, image signals corresponding to RGB may be generated by respective imaging elements and combined so that a color image may be obtained. Alternatively, the imaging unit 11402 may be configured to include a pair of imaging elements for respectively acquiring right-eye image signals and left-eye image signals corresponding to 3D (dimensional) display. By performing the 3D display, the operator 11131 can understand a depth of a living tissue in the operation site more accurately. When the imaging unit 11402 is configured in a multi-plate type, a plurality of systems of lens units 11401 may be provided in correspondence to the imaging elements.

The imaging unit 11402 need not necessarily be provided in the camera head 11102. For example, the imaging unit 11402 may be provided immediately after the objective lens inside the lens barrel 11101.

The drive unit 11403 is configured by an actuator and the zoom lens and the focus lens of the lens unit 11401 are moved by a predetermined distance along an optical axis under the control of the camera head control unit 11405. Accordingly, the magnification and focus of the image captured by the imaging unit 11402 can be adjusted appropriately.

The communication unit 11404 is configured using a communication device for transmitting and receiving various types of information to and from the CCU 11201. The communication unit 11404 transmits the image signal obtained from the imaging unit 11402 as RAW data to the CCU 11201 via the transmission cable 11400.

The communication unit 11404 receives a control signal for controlling driving of the camera head 11102 from the CCU 11201 and supplies the camera head control unit 11405 with the control signal. The control signal includes, for example, information regarding imaging conditions such as information indicating designation of a frame rate of a captured image, information indicating designation of an exposure value at the time of imaging, and/or information indicating designation of a magnification and a focus of the captured image.

Imaging conditions such as the foregoing frame rate, exposure value, magnification, and focus may be designated appropriately by the user or may be set automatically by the control unit 11413 of the CCU 11201 based on the acquired image signal. In the latter case, a so-called auto exposure (AE) function, an auto focus (AF) function, and an auto white balance (AWB) function are provided to the endoscope 11100.

The camera head control unit 11405 controls driving of the camera head 11102 on the basis of a control signal from the CCU 11201 received via the communication unit 11404.

The communication unit 11411 is constituted of a communication apparatus that transmits and receives various kinds of information to and from the camera head 11102. The communication unit 11411 receives an image signal transmitted via the transmission cable 11400 from the camera head 11102.

Further, the communication unit 11411 transmits the control signal for controlling the driving of the camera head 11102 to the camera head 11102. The image signal or the control signal can be transmitted through electric communication, optical communication, or the like.

The image processing unit 11412 performs various types of image processing on the image signal that is the RAW data transmitted from the camera head 11102.

The control unit 11413 performs various kinds of control on imaging of a surgical site by the endoscope 11100, display of a captured image obtained through imaging of a surgical site, or the like. For example, the control unit 11413 generates a control signal for controlling driving of the camera head 11102.

In addition, the control unit 11413 causes the display device 11202 to display a captured image showing a surgical site or the like based on an image signal subjected to the image processing by the image processing unit 11412. In doing so, the control unit 11413 may recognize various objects in the captured image using various image recognition techniques. For example, the control unit 11413 can recognize a surgical instrument such as forceps, a specific biological site, bleeding, mist or the like at the time of use of the energized treatment tool 11112, or the like by detecting a shape, a color, or the like of an edge of an object included in the captured image. When the display device 11202 is caused to display a captured image, the control unit 11413 may superimpose various kinds of surgery support information on an image of the surgical site for display using a recognition result of the captured image. By displaying the surgery support information in a superimposed manner and presenting it to the operator 11131, a burden on the operator 11131 can be reduced, and the operator 11131 can reliably proceed with the surgery.

The transmission cable 11400 that connects the camera head 11102 and the CCU 11201 is an electrical signal cable compatible with communication of electrical signals, an optical fiber compatible with optical communication, or a composite cable of these.

Here, although wired communication is performed using the transmission cable 11400 in the illustrated example, communication between the camera head 11102 and the CCU 11201 may be performed wirelessly.

An example of the endoscopic operation system to which the feature according to the present disclosure can be applied has been described above. The feature according to the present disclosure may be applied to, for example, the endoscope 11100, the imaging unit 11402 of the camera head 11102, the image processing unit 11412 of the CCU 11201, and the like among the components described above. Specifically, the solid-state imaging device 1 described earlier can be applied to the imaging unit 10402. High quality surgical site images with reduced flare generation can be obtained by applying the feature according to the disclosure to the imaging unit 10402.

Here, although the endoscopic operation system has been described as an example, the feature according to the present disclosure may be applied to other, for example, a microscopic operation system.

<9. Exemplary Application to Mobile Object>

The feature of the present disclosure (the present feature) can be applied to various products. For example, the feature according to the present disclosure may be realized as a device equipped in any type of moving body such as an automobile, an electric vehicle, a hybrid electric vehicle, a motorcycle, a bicycle, a personal mobility device, an airplane, a drone, a ship, and a robot.

Figure 27:
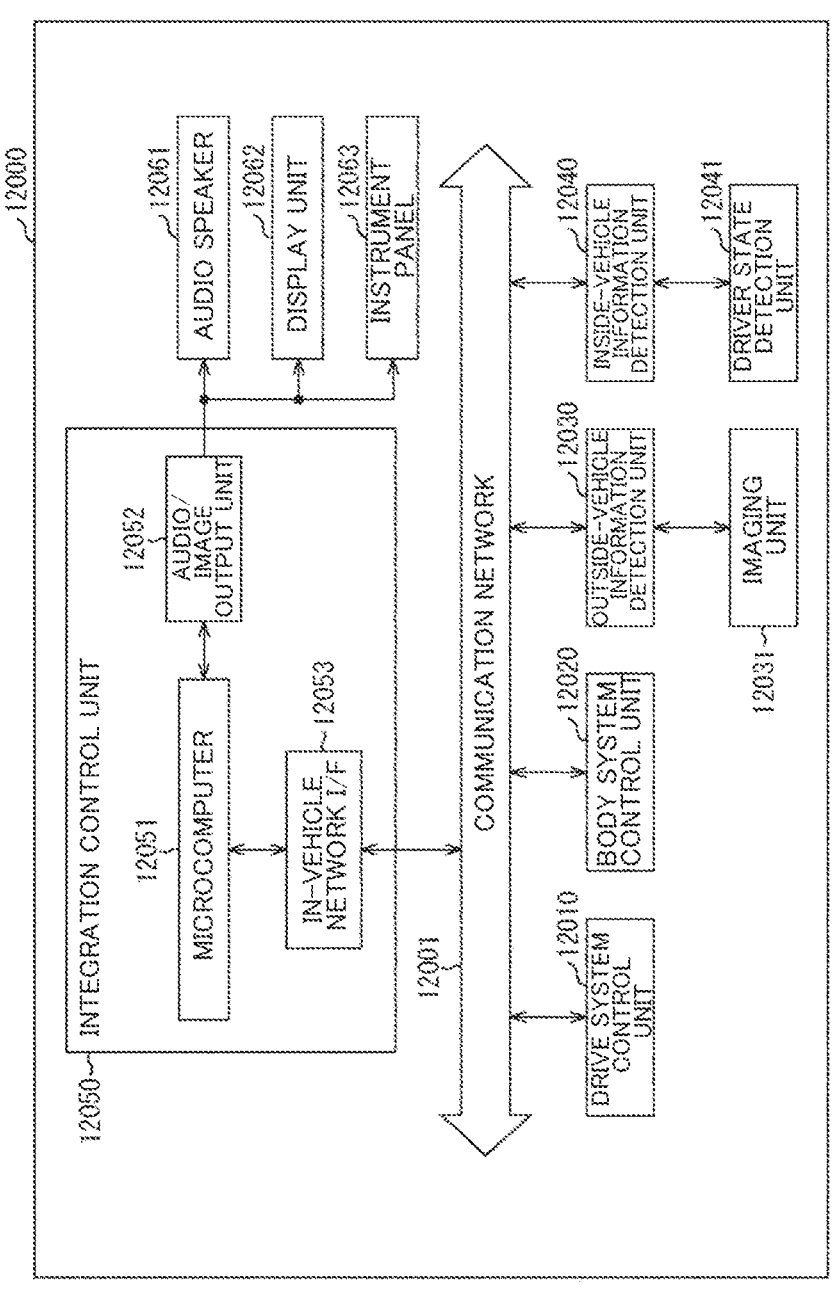
FIG. 27 is a schematic block diagram of an exemplary configuration of a vehicle control system.

FIG. 27 is a block diagram illustrating a schematic configuration example of a vehicle control system, which is an example of a moving body control system to which the feature according to the present disclosure can be applied.

The vehicle control system 12000 includes a plurality of electronic control units connected thereto via a communication network 12001. In the example illustrated in FIG. 27, the vehicle control system 12000 includes a drive system control unit 12010, a body system control unit 12020, an outside-vehicle information detection unit 12030, an inside-vehicle information detection unit 12040, and an integrated control unit 12050. Further, as functional constituents of the integrated control unit 12050, a microcomputer 12051, an audio/image output unit 12052, and an on-vehicle network I/F (Interface) 12053 are shown.

The drive system control unit 12010 controls an operation of an apparatus related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control apparatus such as a braking apparatus that generates a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The outside-vehicle information detection unit 12030 detects information on the outside of the vehicle having the vehicle control system 12000 mounted thereon. For example, an imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform object detection processing or distance detection processing for peoples, cars, obstacles, signs, and letters on the road on the basis of the received image.

The imaging unit 12031 is an optical sensor that receives light and outputs an electrical signal according to the amount of the received light. The imaging unit 12031 can also output the electrical signal as an image or distance measurement information. In addition, the light received by the imaging unit 12031 may be visible light or invisible light such as infrared light.

The inside-vehicle information detection unit 12040 detects information on the inside of the vehicle. For example, a driver state detection unit 12041 that detects a driver's state is connected to the inside-vehicle information detection unit 12040. The driver state detection unit 12041 includes, for example, a camera that captures an image of a driver, and the inside-vehicle information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of information acquired by the outside-vehicle information detection unit 12030 or the inside-vehicle information detection unit 12040 inside and outside the vehicle, and output a control command to the drive system control unit 12010. For example, the microcomputer 12051 can perform cooperative control for the purpose of realization of functions of an advanced driver assistance system (ADAS) including collision avoidance or impact mitigation of a vehicle, follow-up traveling based on an inter-vehicle distance, vehicle speed keeping traveling, a vehicle collision warning, a vehicle lane departure warning, and the like.

Further, the microcomputer 12051 can perform cooperative control for the purpose of automated driving or the like in which autonomous travel is performed without depending on operations of the driver, by controlling the driving force generator, the steering mechanism, or the braking device and the like on the basis of information about the surroundings of the vehicle, the information being acquired by the outside-vehicle information detection unit 12030 or the inside-vehicle information detection unit 12040.

In addition, the microcomputer 12051 can output a control command to the body system control unit 12030 based on the information outside the vehicle acquired by the outside-vehicle information detection unit 12030. For example, the microcomputer 12051 can perform coordinated control for the purpose of antiglare such as switching a high beam to a low beam by controlling a headlamp according to a position of a preceding vehicle or an oncoming vehicle detected by the outside-vehicle information detection unit 12030.

The audio/image output unit 12052 transmits an output signal of at least one of sound and an image to an output device capable of visually or audibly notifying a passenger or the outside of the vehicle of information. In the example of FIG. 27, an audio speaker 12061, a display unit 12062, and an instrument panel 12063 are illustrated as examples of the output device. The display unit 12062 may include at least one of an on-board display and a head-up display, for example.

Figure 28:
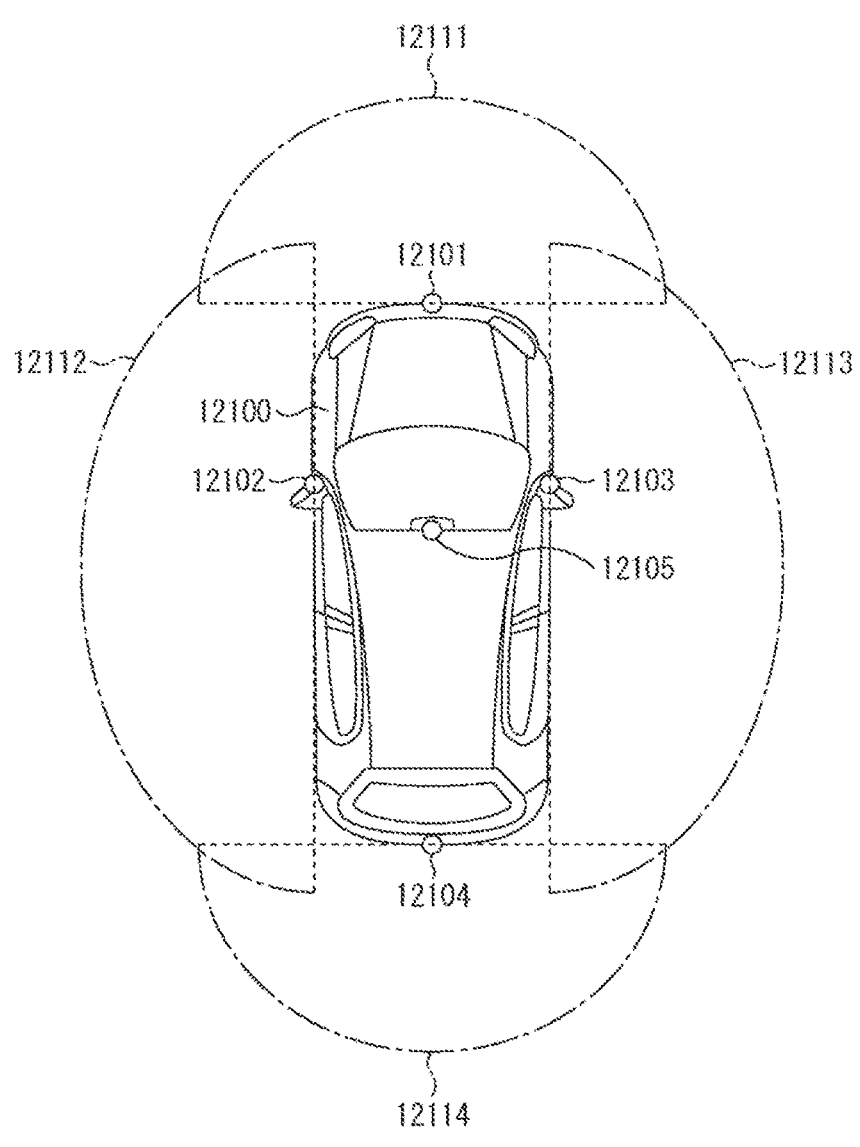
FIG. 28 is a diagram for illustrating an exemplary installation position for an outside-vehicle information detection unit and an imaging unit.

FIG. 28 is a diagram showing an example of an installation position of the imaging unit 12031.

In FIG. 28, the imaging unit 12031 includes imaging units 12101, 12102, 12103, 12104, and 12105.

The imaging units 12101, 12102, 12103, 12104, and 12105 are provided at, for example, positions of a front nose, side mirrors, a rear bumper, a back door, an upper portion of a vehicle internal front windshield, and the like of the vehicle 12100. The imaging unit 12101 provided on a front nose and the imaging unit 12105 provided in an upper portion of the vehicle internal front windshield mainly acquire images in front of the vehicle 12100. The imaging units 12102 and 12103 provided in the side mirrors mainly acquire images on the lateral sides of the vehicle 12100. The imaging unit 12104 included in the rear bumper or the back door mainly acquires an image of an area behind the vehicle 12100. The imaging unit 12105 included in the upper portion of the windshield inside the vehicle is mainly used for detection of a preceding vehicle, a pedestrian, an obstacle, a traffic signal, a traffic sign, a lane, or the like.

FIG. 28 illustrates an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, by superimposing image data captured by the imaging units 12101 to 12104, it is possible to obtain a bird's-eye view image viewed from the upper side of the vehicle 12100.

At least one of the imaging units 12101 to 12104 may have a function for obtaining distance information. For example, at least one of the imaging units 12101 to 12104 may be a stereo camera constituted by a plurality of imaging elements or may be an imaging device that has pixels for phase difference detection.

For example, the microcomputer 12051 can extract, particularly, a closest three-dimensional object on a path through which the vehicle 12100 is traveling, which is a three-dimensional object traveling at a predetermined speed (for example, 0 km/h or higher) in the substantially same direction as the vehicle 12100, as a preceding vehicle by acquiring a distance to each three-dimensional object in the imaging ranges 12111 to 12114 and temporal change in the distance (a relative speed with respect to the vehicle 12100) on the basis of distance information obtained from the imaging units 12101 to 12104. Further, the microcomputer 12051 can set an inter-vehicle distance to be secured in advance with the rear of the preceding vehicle and perform automatic brake control (including follow-up stop control), automatic acceleration control (including follow-up start control), and the like. This can perform cooperative control for the purpose of, for example, autonomous driving in which the vehicle autonomously travels without the need for driver's operations.

For example, the microcomputer 12051 can classify and extract three-dimensional data regarding three-dimensional objects into two-wheeled vehicles, normal vehicles, large vehicles, pedestrians, and other three-dimensional objects such as electric poles based on distance information obtained from the imaging units 12101 to 12104 and can use the three-dimensional data to perform automated avoidance of obstacles. For example, the microcomputer 12051 differentiates surrounding obstacles of the vehicle 12100 into obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than a set value and there is a possibility of collision, an alarm is output to the driver through the audio speaker 12061 or the display unit 12062, forced deceleration or avoidance steering is performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating an outline of an object to determine whether or not the object is a pedestrian. When the microcomputer 12051 determines that there is a pedestrian in the captured images of the imaging units 12101 to 12104 and the pedestrian is recognized, the audio/image output unit 12052 controls the display unit 12062 so that a square contour line for emphasis is superimposed and displayed with the recognized pedestrian. In addition, the audio/image output unit 12052 may control the display unit 12062 so that an icon indicating a pedestrian or the like is displayed at a desired position.

An example of the vehicle control system to which the feature according to the present disclosure can be applied has been described above. The feature according to the present disclosure can be applied, for example, to each imaging unit 12031 among the components described above. Specifically, the solid-state imaging device 1 described earlier can be applied to the imaging unit 12031. High quality surgical site images with reduced flare generation can be obtained by applying the feature according to the disclosure to the imaging unit 12031. In addition, using the obtained captured images, driver's fatigue can be reduced and increase driver and vehicle safety.

The advantageous effects described in the present specification are merely exemplary and are not limited, and other advantageous effects of the advantageous effects described in the present specification may be achieved.

The present feature can also have the following configurations.

(1)

A solid-state imaging device including a semiconductor substrate having a pixel area having a plurality of pixels provided therein, and a transparent structure joined to a light incident surface side of the semiconductor substrate with resin and having a hollow structure.

(2)

The solid-state imaging device according to (1), wherein the transparent structure includes a glass substrate and a transparent film, and the hollow structure is formed between the glass substrate and the transparent film.

(3)

The solid-state imaging device according to (2), wherein the hollow structure is formed by sealing an opening formed in the glass substrate at a prescribed depth with the transparent film.

(4)

The solid-state imaging device according to (2), further including an anti-reflection film at an inner surface of the hollow structure.

(5)

The solid-state imaging device according to (4), wherein the anti-reflection film includes a plurality of transparent films layered on each other.

(6)

The solid-state imaging device according to (5), wherein the plurality of transparent films have refractive indexes reduced in order of distance from the light incident surface side.

(7)

The solid-state imaging device according to any one of (1) to (6), wherein the hollow structure is formed only in an area corresponding to the pixel area in a plan view.

(8)

The solid-state imaging device according to any one of (1) to (6), wherein the hollow structure is formed in the entire area of the transparent structure in a plan view.

(9)

The solid-state imaging device according to any one of (3) to (6), wherein the transparent structure has the hollow structures in multiple stages.

(10)

The solid-state imaging device according to (9), wherein the openings of the hollow structures in the multiple stages have different widths among the stages.

(11)

The solid-state imaging device according to (9) or (10), wherein the openings of the hollow structures in the multiple stages are formed to cover the entire pixel area in a plan view.

(12)

The solid-state imaging device according to any one of (3) to (6) and (9) to (11), wherein the opening in the transparent structure is formed in a line shape.

(13)

The solid-state imaging device according to (12), wherein the transparent structure has the hollow structures in multiple stages, and the openings are arranged differently among the stages.

(14)

The solid-state imaging device according to any one of (1) to (13), wherein the hollow structure is provided at least at one of a first surface as a light incident surface of the transparent structure and a second surface opposed to the first surface.

(15)

The solid-state imaging device according to any one of (1) to (14), further including a correction film provided at any one of a first surface as a light incident surface of the transparent structure and a second surface opposed to the first surface.

(16)

A method for manufacturing a solid-state imaging device, the method including:

forming a hollow structure in a transparent structure; and joining the transparent structure to a light incident surface side of a semiconductor substrate having a plurality of pixel areas with resin.

(17)

The method for manufacturing a solid-state imaging device according to (16), wherein the transparent structure includes a glass substrate, and the method includes forming the hollow structure by forming an opening in the glass substrate by etching, and then forming a transparent film at an upper part of the opening, thereby sealing the opening.

(18)

The method for manufacturing a solid-state imaging device according to (17), wherein the opening is formed by the etching to have a rectangular cross sectional shape.

(19)

The method for manufacturing a solid-state imaging device according to (17) or (18), wherein the etching is wet etching, and the film for sealing the opening is formed by CVD.

(20)

The method for manufacturing a solid-state imaging device according to any one of (17) to (19) further including forming a plurality of transparent films at side and bottom surfaces of the opening, and the transparent films have refractive indexes reduced in order of distance from the light incident surface side of incident light.

REFERENCE SIGNS LIST

1 Solid-state imaging device
11 Lower substrate (logic substrate)
12 Upper substrate (pixel sensor substrate)
13 Laminated substrate
15 Color filter
16 On-chip lens
17 Glass sealing resin
18 Glass protective substrate
21 Pixel area
22 Control circuit
23 Logic circuit
32 Pixel
51 Photodiode
81 Silicon substrate
83 Wiring layer
86 Insulating film
88 Through silicon via
91 Solder mask
101 Silicon substrate
103 Wiring layer
105 Through-chip via
106 Connection wiring
109 Through-silicon via
151 Transparent film
152 Anti-reflection film
161 Cavity
211 Opening
212 Opening
251 Pixel upper area
261 Correction film
1001 Imaging apparatus
1002 Optical system
1004 Solid-state imaging device

What is claimed is:

1. A solid-state imaging device, comprising:
a semiconductor substrate having a pixel area having a plurality of pixels formed therein; and
a transparent structure joined to a light incident surface side of the semiconductor substrate with a resin and having a hollow structure,
wherein the transparent structure includes a glass substrate and a transparent film,
wherein the glass substrate has a first surface side on a light incident surface side of the glass substrate and a second surface side opposite the first surface side,
wherein the hollow structure is formed by sealing an opening formed in the second surface side of the glass substrate with the transparent film, and
wherein the transparent film is between the glass substrate and the resin.

2. The solid-state imaging device according to claim 1, wherein
the hollow structure is formed between the glass substrate and the transparent film.

3. The solid-state imaging device according to claim 2, wherein the opening formed in the glass substrate is sealed at a prescribed depth with the transparent film.

4. The solid-state imaging device according to claim 3, wherein the transparent structure includes a plurality of the hollow structures, and wherein the transparent structure has the hollow structures in multiple stages.

5. The solid-state imaging device according to claim 4, wherein the openings of the hollow structures in the multiple stages have different widths among the stages.

6. The solid-state imaging device according to claim 4, wherein the openings of the hollow structures in the multiple stages are formed to cover an entire pixel area in a plan view.

7. The solid-state imaging device according to claim 3, wherein the opening in the transparent structure is formed in a line shape.

8. The solid-state imaging device according to claim 7, wherein the transparent structure has the hollow structures in multiple stages, and the openings are arranged differently among the stages.

9. The solid-state imaging device according to claim 1, further comprising an anti-reflection film at an inner surface of the hollow structure.

10. The solid-state imaging device according to claim 9, wherein the anti-reflection film includes a plurality of transparent films layered on each other.

11. The solid-state imaging device according to claim 1, wherein the hollow structure is formed only in an area corresponding to the pixel area in a plan view.

12. The solid-state imaging device according to claim 1, wherein the hollow structure is formed in an entire area of the transparent structure in a plan view.

13. The solid-state imaging device according to claim 1, wherein the hollow structure is provided at least at one of a first surface as a light incident surface of the transparent structure and a second surface opposed to the first surface.

14. The solid-state imaging device according to any claim 1, further comprising a correction film provided at any one of a first surface as a light incident surface of the transparent structure and a second surface opposed to the first surface.

15. A solid-state imaging device, comprising:
a semiconductor substrate having a pixel area having a plurality of pixels formed therein; and
a transparent structure joined to a light incident surface side of the semiconductor substrate with a resin and having a hollow structure; and
an anti-reflection film at an inner surface of the hollow structure,
wherein the transparent structure includes a glass substrate and a transparent film,
wherein the hollow structure is formed between the glass substrate and the transparent film,
wherein the anti-reflection film includes a plurality of transparent films layered on each other, and
wherein the plurality of transparent films have refractive indexes reduced in order of distance from the light incident surface side.

16. The solid-state imaging device according to claim 15, wherein the hollow structure is formed only in an area corresponding to the pixel area in a plan view.

17. The solid-state imaging device according to claim 15, wherein the hollow structure is formed in an entire area of the transparent structure in a plan view.

18. A method for manufacturing a solid-state imaging device, the method comprising:

forming a hollow structure in a transparent structure, wherein the transparent structure includes a glass substrate, and wherein the method includes forming the hollow structure by forming an opening in the glass substrate by etching, and then forming a transparent film at an upper part of the opening, thereby sealing the opening;

joining the transparent structure to a light incident surface side of a semiconductor substrate having a plurality of pixel areas with resin; and forming a plurality of transparent films at side and bottom surfaces of the opening, and the transparent films have refractive indexes reduced in order of distance from the light incident surface side of incident light.

19. The method for manufacturing a solid-state imaging device according to claim 18, wherein the opening is formed by the etching to have a rectangular cross sectional shape.

20. The method for manufacturing a solid-state imaging device according to claim 18, wherein the etching is wet etching, and the film for sealing the opening is formed by CVD.

* * * * *